(12) United States Patent
Rofougaran et al.

(10) Patent No.: US 8,254,319 B2
(45) Date of Patent: Aug. 28, 2012

(54) WIRELESS PROGRAMMABLE LOGIC DEVICE

(75) Inventors: Ahmadreza (Reza) Rofougaran, Newport Coast, CA (US); Timothy W. Markison, Mesa, AZ (US)

(73) Assignee: Broadcom Corporation, Irvine, CA (US)

( * ) Notice: Subject to any disclaimer, the term of this patent is extended or adjusted under 35 U.S.C. 154(b) by 947 days.

(21) Appl. No.: 12/236,272

(22) Filed: Sep. 23, 2008

(65) Prior Publication Data

US 2009/0196199 A1    Aug. 6, 2009

Related U.S. Application Data

(63) Continuation-in-part of application No. 12/026,681, filed on Feb. 6, 2008, and a continuation-in-part of application No. 11/700,285, filed on Jan. 31, 2007, and a continuation-in-part of application No. 11/888,068, filed on Jul. 31, 2007, now Pat. No. 8,010,735.

(51) Int. Cl.
*H04W 4/00* (2009.01)
*H04B 1/38* (2006.01)

(52) U.S. Cl. ..... 370/329; 370/338; 455/90.1; 455/550.1
(58) Field of Classification Search .................. None
See application file for complete search history.

(56) References Cited

U.S. PATENT DOCUMENTS

| | | | |
|---|---|---|---|
| 4,807,183 A | 2/1989 | Kung | |
| 5,502,683 A | 3/1996 | Marchioro | |
| 5,754,948 A | 5/1998 | Metze | |
| 5,786,912 A | 7/1998 | Kartalopoulos | |
| 5,809,321 A | 9/1998 | Hansen | |
| 5,884,104 A | 3/1999 | Chase | |
| 6,182,203 B1 | 1/2001 | Simar | |
| 6,234,900 B1 | 5/2001 | Cumbers | |
| 6,438,622 B1 | 8/2002 | Haghighi et al. | |
| 6,500,070 B1 | 12/2002 | Tomizawa et al. | |
| 6,663,295 B2 | 12/2003 | Kami et al. | |
| 6,735,663 B2 | 5/2004 | Watts, Jr. et al. | |

(Continued)

FOREIGN PATENT DOCUMENTS

EP    1499070 A2    1/2005

(Continued)

OTHER PUBLICATIONS

Bruce K Gale, "RF, Electrical, and Magnetic Microsystems," date unknown, 8 pages.

(Continued)

*Primary Examiner* — Marcus R Smith
(74) *Attorney, Agent, or Firm* — Garlick & Markison; Timothy W. Markison; Jessica W. Smith

(57) ABSTRACT

A programmable logic device includes a control module, a plurality of input/output modules, and a plurality of configurable logic and millimeter wave (MMW) transceiver modules (CXM). The control module is operable to: receive a programming instruction; identify a set of the plurality of CXMs based on the programming instruction; identify at least one of the plurality of input/output modules based on the programming instruction; determine configuration of the set of the plurality of CXMs and the at least one of input/output modules in accordance with the programming instruction; and allocate wireless communication resources of the programmable logic device to support the configuration of the set of the plurality of CXMs and the at least one of the plurality of input/output modules.

24 Claims, 12 Drawing Sheets

U.S. PATENT DOCUMENTS

| | | | |
|---|---|---|---|
| 6,735,708 B2 | 5/2004 | Watts, Jr. | |
| 6,801,974 B1 | 10/2004 | Watts, Jr. et al. | |
| 6,816,925 B2 | 11/2004 | Watts, Jr. | |
| 7,065,326 B2 | 6/2006 | Lovberg | |
| 7,082,285 B2 | 7/2006 | Linde | |
| 7,149,837 B2 | 12/2006 | Watts, Jr. et al. | |
| 7,159,099 B2 | 1/2007 | Lucas | |
| 7,171,050 B2 | 1/2007 | Kim | |
| 7,197,584 B2 | 3/2007 | Huber et al. | |
| 7,218,143 B1 | 5/2007 | Young | |
| 7,257,093 B1 | 8/2007 | Witzke | |
| 7,330,702 B2 | 2/2008 | Chen et al. | |
| 7,406,062 B2 | 7/2008 | Hsu | |
| 7,444,393 B2 | 10/2008 | Chung | |
| 7,595,766 B2 * | 9/2009 | Rofougaran | 343/795 |
| 7,903,724 B2 | 3/2011 | Rofougaran | |
| 7,929,474 B2 | 4/2011 | Pettus | |
| 2002/0022521 A1 | 2/2002 | Idaka | |
| 2002/0049806 A1 | 4/2002 | Gatz et al. | |
| 2002/0061012 A1 | 5/2002 | Thi | |
| 2002/0107010 A1 | 8/2002 | Witte | |
| 2002/0164945 A1 | 11/2002 | Olsen | |
| 2003/0001882 A1 | 1/2003 | Macer et al. | |
| 2003/0017845 A1 | 1/2003 | Doviak | |
| 2003/0040284 A1 | 2/2003 | Sato | |
| 2003/0059022 A1 | 3/2003 | Nebiker | |
| 2003/0078071 A1 | 4/2003 | Uchimyama | |
| 2003/0112585 A1 | 6/2003 | Silvester | |
| 2003/0126335 A1 | 7/2003 | Silvester | |
| 2003/0128712 A1 | 7/2003 | Moriwaki | |
| 2003/0162503 A1 | 8/2003 | LeCren | |
| 2003/0172380 A1 | 9/2003 | Kikinis | |
| 2003/0221036 A1 | 11/2003 | Konetski | |
| 2004/0053631 A1 * | 3/2004 | Spicer | 455/502 |
| 2004/0054776 A1 | 3/2004 | Klotz | |
| 2004/0062308 A1 | 4/2004 | Kamosa | |
| 2004/0117442 A1 | 6/2004 | Thielen | |
| 2004/0123113 A1 | 6/2004 | Mathiassen et al. | |
| 2004/0153863 A1 | 8/2004 | Klotz | |
| 2004/0157559 A1 | 8/2004 | Sugikawa | |
| 2004/0174431 A1 | 9/2004 | Stienstra | |
| 2004/0203364 A1 | 10/2004 | Silvester | |
| 2004/0266336 A1 | 12/2004 | Patsiokas et al. | |
| 2005/0014468 A1 | 1/2005 | Salokannel | |
| 2005/0060598 A1 | 3/2005 | Klotz | |
| 2005/0124307 A1 | 6/2005 | Ammar et al. | |
| 2005/0185364 A1 | 8/2005 | Bell | |
| 2005/0250531 A1 | 11/2005 | Takebe et al. | |
| 2005/0281220 A1 * | 12/2005 | Stanwood et al. | 370/328 |
| 2006/0026348 A1 | 2/2006 | Wallace | |
| 2006/0038731 A1 | 2/2006 | Turner | |
| 2006/0046762 A1 | 3/2006 | Yoon et al. | |
| 2006/0085675 A1 | 4/2006 | Popell | |
| 2006/0101164 A1 | 5/2006 | Lee | |
| 2006/0148568 A1 | 7/2006 | Schultz et al. | |
| 2006/0164271 A1 | 7/2006 | Hirt | |
| 2006/0167784 A1 | 7/2006 | Hoffberg | |
| 2006/0176851 A1 | 8/2006 | Bennett | |
| 2006/0190691 A1 | 8/2006 | Chauve | |
| 2006/0203758 A1 | 9/2006 | Tee et al. | |
| 2006/0252470 A1 | 11/2006 | Seshadri | |
| 2006/0260546 A1 | 11/2006 | Usami | |
| 2006/0262026 A1 | 11/2006 | Gainey et al. | |
| 2006/0269004 A1 | 11/2006 | Ibrahim | |
| 2006/0282635 A1 | 12/2006 | Mather | |
| 2007/0015558 A1 | 1/2007 | Zalewski et al. | |
| 2007/0038808 A1 | 2/2007 | Yim | |
| 2007/0147152 A1 | 6/2007 | Sekiguchi | |
| 2007/0155502 A1 | 7/2007 | Wu | |
| 2007/0167149 A1 | 7/2007 | Comstock | |
| 2007/0229270 A1 | 10/2007 | Rofougaran | |
| 2007/0239929 A1 | 10/2007 | Chen | |
| 2007/0268481 A1 | 11/2007 | Raskar et al. | |
| 2007/0298882 A1 | 12/2007 | Marks et al. | |
| 2008/0020843 A1 | 1/2008 | Wolinsky | |
| 2008/0028118 A1 | 1/2008 | Sayers et al. | |
| 2008/0040541 A1 | 2/2008 | Borckmann | |
| 2008/0063236 A1 | 3/2008 | Ikenoue et al. | |
| 2008/0070516 A1 | 3/2008 | Lee | |
| 2008/0076406 A1 | 3/2008 | Chen | |
| 2008/0151847 A1 | 6/2008 | Abujbara | |
| 2008/0244148 A1 | 10/2008 | Nix et al. | |
| 2009/0006640 A1 | 1/2009 | Brouwer | |
| 2009/0198854 A1 | 8/2009 | Rofougaran | |
| 2009/0215533 A1 | 8/2009 | Zalewski et al. | |
| 2010/0056132 A1 | 3/2010 | Gallagher | |
| 2010/0120447 A1 | 5/2010 | Anderson et al. | |
| 2010/0146199 A1 | 6/2010 | Shaeffer | |
| 2010/0273468 A1 | 10/2010 | Bienas et al. | |
| 2011/0134868 A1 | 6/2011 | Lee et al. | |

FOREIGN PATENT DOCUMENTS

WO 2009002464 A2 12/2008

OTHER PUBLICATIONS

Dr. Lynn Fuller, "Microelectromechanical Systems (MEMs) Applications—Microphones,"Rochester Institute of Technology Microelectronic Engineering, Apr. 25, 2005, pp. 1-43.

Radio Control Adapter; IBM Technical Disclosure Bulletin NN86081337; IBM; Aug. 1986.

Haworth, et al.; Public Security Screening for Metallic Objects with Millimetre-Wave Images; Heriot-Watt University; United Kingdom; pp. 1-4.

Elsadek, et al.; "A Compact 3-D Microwave Holographic Pointer System Using a Size Reduced Microstrip Planar Array"; Department of Electrical and Computer Engineering; University of California; pp. 1-5.

Elsadek, et al.; "Microstrip Multi-element Diversity Antenna Array for Three Dimensional Microwave Holographic Input Pointer (Holo3D)"; Department of Electrical and Computer Engineering; University of California; pp. 1-4.

E3 Wii Controller; Nintendo Wilmote; Technology Limitations; XGaming, Inc.; pp. 1-5.

Xilinx Inc.: Spartan-3AN FPGA Family Data Sheet, DS557, Jun. 2, 2008, pp. 5.

* cited by examiner

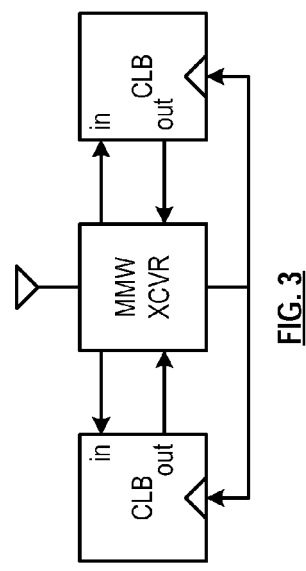
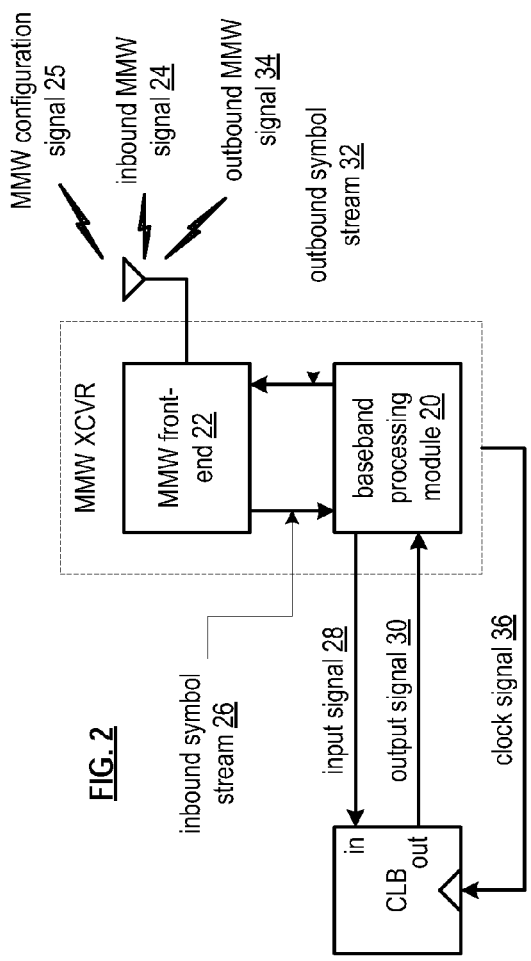
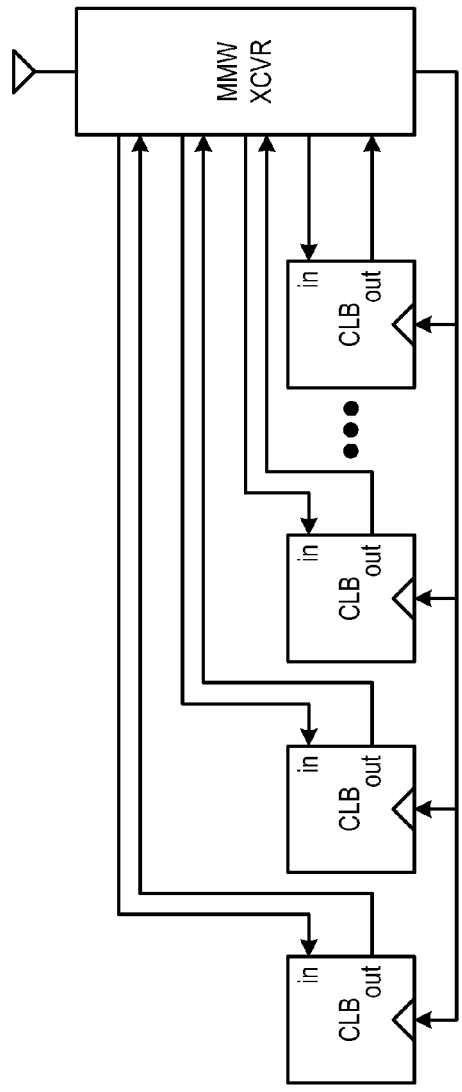

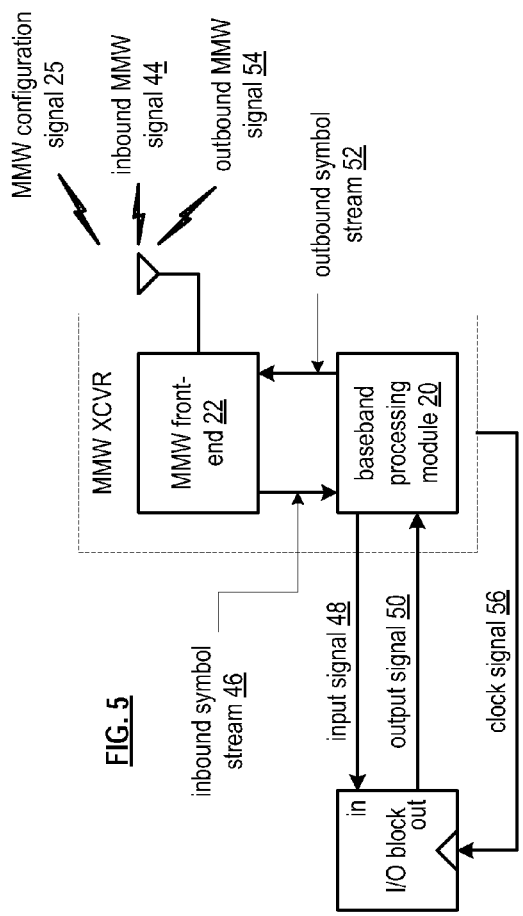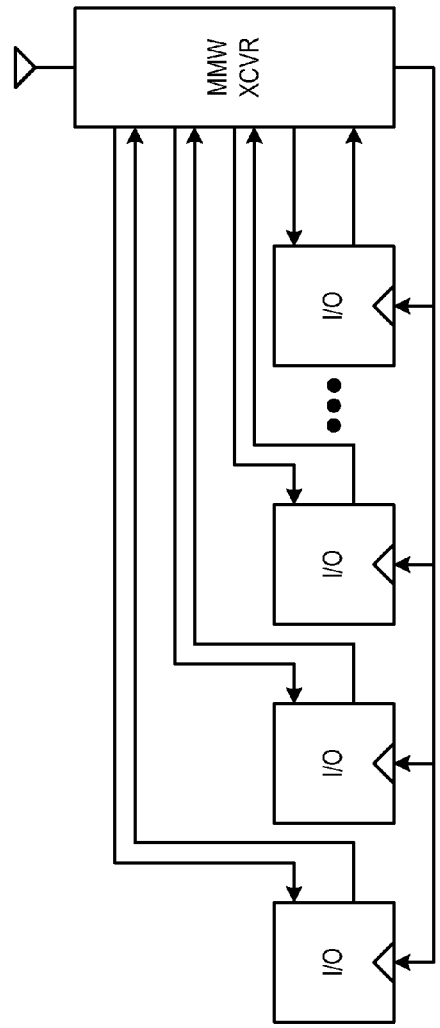

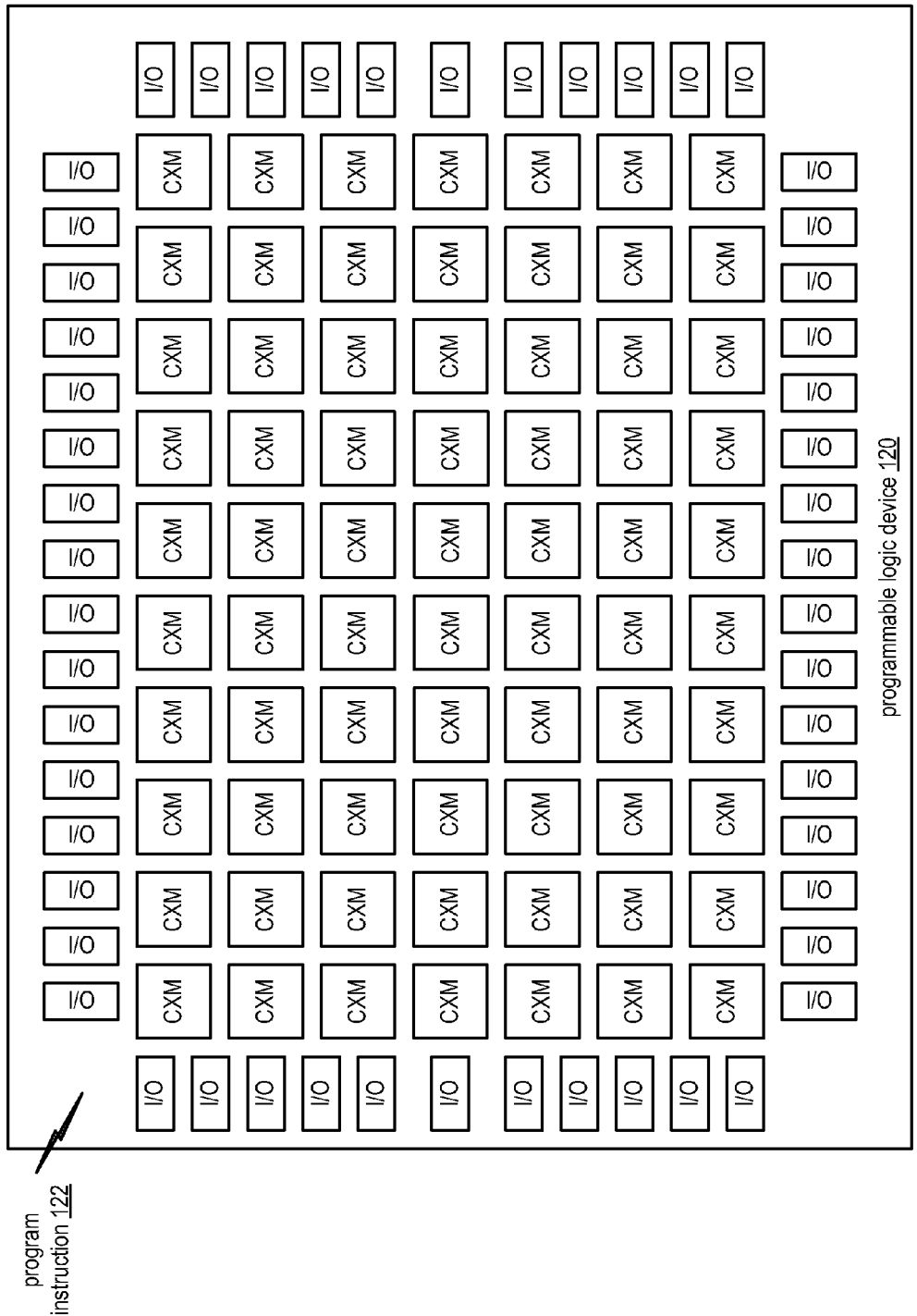

WIRELESS PROGRAMMABLE LOGIC DEVICE

This patent application is claiming priority under 35 USC §120 as a continuation in part patent application of co-pending patent applications:
1. entitled COMPUTING DEVICE WITH HANDHELD AND EXTENDED COMPUTING UNITS, having a filing date of Feb. 6, 2008, and a Ser. No. 12/026,681;
2. RF BUS CONTROLLER, having a filing date of Jan. 31, 2007, and a Ser. No. 11/700,285; and
3. entitled FLASH MEMORY WITH MILLIMETER WAVE HOST INTERFACE AND METHOD FOR USE THEREWITH, having a filing date of Jul. 31, 2007, and a Ser. No. 11/888,068.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to computing devices and more particularly to components of such computing devices.

2. Description of Related Art

Communication systems are known to support wireless and wire lined communications between wireless and/or wire lined communication devices. Such communication systems range from national and/or international cellular telephone systems to the Internet to point-to-point in-home wireless or wired networks. The wireless and/or wire lined communication devices may be personal computers, laptop computers, personal digital assistants (PDA), cellular telephones, personal digital video players, personal digital audio players, global positioning system (GPS) receivers, video game consoles, entertainment devices, etc.

Many of the communication devices include a similar basic architecture: that being a processing core, memory, and peripheral devices. The memory stores operating instructions that the processing core uses to generate data, which may also be stored in the memory. The peripheral devices allow a user of the communication device to direct the processing core as to which programs and hence which operating instructions to execute, to enter data, etc. and to see the resulting data. For example, a cellular telephone includes a keypad, a display, a microphone and a speaker for such functions.

The processing core may include one or more digital signal processors (DSP), one or more microprocessors, and/or one or more programmable logic devices (e.g., field programmable gate arrays [FPGA], complex programmable logic device [CPLD], field programmable analog arrays [FPAA], etc.). The basic architecture of a DSP and of a microprocessor is known to include an instruction cache, a data cache, and an execution unit (e.g., a multiply-accumulator for a DSP and an arithmetic unit for a microprocessor). The basic architecture of a programmable logic device is also known to include a plurality of configurable logic blocks (CLB), a plurality of input/output blocks (IOB), and a plurality of switching modules that are programmable to couple one or more of the CLBs together and/or couple one or more CLBs to one or more IOBs. While programmable logic devices are programmable to execute a wide variety of algorithms, the CLBs, IOBs and switching modules are fixed and hard wired.

As integrated circuit technology advances, the basic architecture of a programmable logic device is increasing in complexity, capabilities, and size reduction. However, communication within programmable logic device is done using traces (e.g., on an IC and/or on a PCB), which requires drivers to drive the lines. As is known, the transferring of data via the traces and drivers consumes a significant amount of power, which produces heat. With many programmable logic devices architectures, heat dissipation is a critical issue. In addition, the numerous traces within the programmable logic device to support the switching function of the switching modules exhibits various transmission line and/or line propagation issues, which limits size reduction, frequency of operation, and/or performance.

Therefore, a need exists for a configurable programmable logic device that reduces power consumption and provides flexibility in implementation.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

FIG. 2 is a schematic block diagram of an embodiment of a configurable logic block & MMW transceiver module in accordance with the present invention;

FIG. 3 is a schematic block diagram of another embodiment of a configurable logic block & MMW transceiver module in accordance with the present invention;

FIG. 4 is a schematic block diagram of another embodiment of a configurable logic block & MMW transceiver module in accordance with the present invention;

FIG. 5 is a schematic block diagram of an embodiment of an input/output module in accordance with the present invention;

FIG. 6 is a schematic block diagram of another embodiment of an input/output module in accordance with the present invention;

FIG. 7 is a schematic block diagram of another embodiment of an input/output module in accordance with the present invention;

FIG. 22 is a schematic block diagram of another embodiment of a configurable logic device in accordance with the present invention.

DETAILED DESCRIPTION OF THE INVENTION

Figure 1:
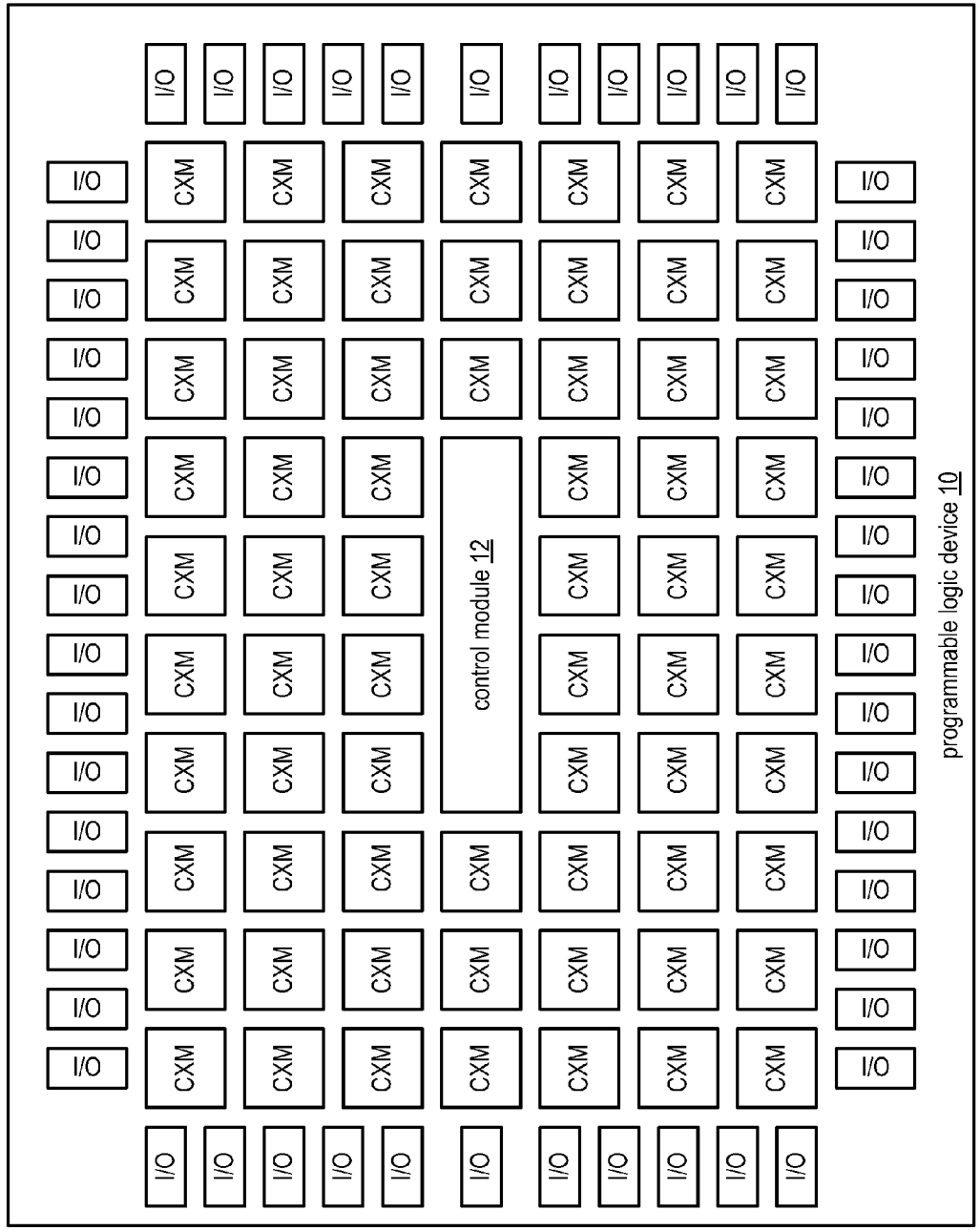
FIG. 1 is a schematic block diagram of an embodiment of a programmable logic device in accordance with the present invention.

FIG. 1 is a schematic block diagram of an embodiment of a programmable logic device 10 that includes a control module 12, a plurality of a plurality of input/output (I/O) modules, and a plurality of configurable logic and millimeter wave (MMW) transceiver modules (CXM). Each of the I/O modules includes one or more I/O blocks and a MMW transceiver and each of the CXMs includes one or more configurable logic blocks (CLB) and a MMW transceiver.

The control module 12 (an embodiment of which will be described in greater detail with reference to FIG. 8) functions to receive a programming instruction. The programming instruction may be one of a plurality of programming instructions to configure the programmable logic device 10. The plurality of programming instructions may be generated from a netlist, which in turn may be generated from a program written in a hardware description language or from a schematic design.

The control module 12 then identifies a set of the plurality of CXMs and at least one of the plurality of (I/O) modules based on the programming instruction. In addition, the control module 12 determines configuration of the set of the plurality of CXMs and the at least one of input/output modules in accordance with the programming instruction. For instance, if the programming instruction, or a set of programming instructions, indicates that two CXMs should be coupled together and one of them coupled to an I/O module, the control module 12 will identify two CXMs and one I/O module to use. The selection of the two CXMs and the I/O module may be dictated within the programming instruction(s) or may be determined by the control module 12. In the latter case, the control module 12 may make the determination based on available XCMs, available I/O modules, proximity to each other, proximity of other functions, etc.

The control module 12 then allocates wireless communication resources (e.g., one or more channels of a frequency band, one or more division multiple access slots of a channel, etc.) to support the configuration of the set of the plurality of CXMs and the at least one of the plurality of input/output modules. In this manner, the configured CXMs and I/O modules will communication via the allocated wireless communication resources to implement the desired function or functions.

FIG. 2 is a schematic block diagram of an embodiment of a configurable logic block & MMW transceiver module (CXM) that includes a configurable logic block (CLB) and a millimeter wave (MMW) transceiver (MMW XCVR). The MMW transceiver includes a baseband processing module 20 and a MMW front-end 22. The CLB includes a configurable switch matrix with 4 or 6 inputs, selection circuitry (e.g., a multiplexer), and one or more flip-flops. The switch matrix can be configured to provide combinational logic, shift registers, random access memory, and/or logic gates (e.g., AND, OR, NAND, NOR, XOR, etc.).

The baseband processing module 20 may be a single processing device or a plurality of processing devices. Such a processing device may be a microprocessor, micro-controller, digital signal processor, state machine, logic circuitry, analog circuitry, digital circuitry, and/or any device that manipulates signals (analog and/or digital) based on hard coding of the circuitry and/or operational instructions. The baseband processing module 20 may have an associated memory and/or memory element, which may be a single memory device, a plurality of memory devices, and/or embedded circuitry of the baseband processing module 20. Such a memory device may be a read-only memory, random access memory, volatile memory, non-volatile memory, static memory, dynamic memory, flash memory, cache memory, and/or any device that stores digital information. Note that when the baseband processing module 20 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the baseband processing module executes, hard coded and/or operational instructions corresponding to at least some of the steps and/or functions illustrated in FIGS. 2-21.

As part of programming the programmable logic device, the configurable logic block & MMW transceiver module (CXM) receives a MMW configuration signal 25 via at least one set up wireless communication resource. The MMW front-end converts the MMW configuration signal 25 into an inbound symbol stream 26. The baseband processing module 20 processes the inbound symbol stream 26 to retrieve the configuration information, which includes one or more allocated communication resources and CLB configuration information to configure the switch matrix of the CLB. The baseband processing module 20 stores the identity of the allocation communication resource(s) and provides the CLB configuration information to the CLB. The CLB configures itself in accordance with the CLB configuration information.

During execution of a programmed function, the MMW transceiver receives an MMW clock source signal (not shown) and generates at least one clock signal 36 therefrom. The MMW transceiver provides the at least one clock signal 36 to the CLB. Embodiments of the MMW transceiver generating the at least one clock signal 36 are described with reference to FIGS. 18 and 19.

In addition, the MMW transceiver receives an inbound MMW signal 24, which includes input data for the associated CLB. The MMW front-end 22 converts the inbound MMW signal 24 into an inbound symbol stream 26. The baseband processing module 20 converts the inbound symbol stream 26 into an input signal 28. In this instance, the baseband processing module 20 may convert the inbound symbol stream 26 into the input signal 28 by performing one or more of time-to-frequency domain conversion (e.g., fast Fourier transform), data demodulation (e.g., x-bit quadrature amplitude modulation (QAM) demapping, frequency shift keying (FSK) demodulation, quadrature phase shift keying (QPSK) demodulation, binary phase shift keying (BPSK) demodulation, amplitude shift keying (ASK) demodulation, a combination thereof, and/or variations thereof), deinterleaving, and decoding, which may include Viterbi decoding, descrambling, depuncturing, space-time-frequency decoding, beamforming decoding, and/or any other type of decoding.

The CLB receives the input signal 28 as a data input and performs its configured logical operation upon the input signal to produce an output signal 30. The baseband processing module 20 converts the output signal 30 into an outbound symbol stream 32. In this instance, the baseband processing module 20 may convert the output signal 30 into the outbound symbol stream 32 by performing one or more of encoding (e.g., ½ rate, ⅔ rate, or other rate convolutional encoding, scrambling, puncturing, and/or any other type of encoding), interleaving, data modulation (e.g., x-QAM mapping, FSK modulation, QPSK modulation, BPSK modulation, ASK modulation, etc.), and frequency-to-time domain conversion (e.g., inverse fast Fourier transform). In addition, the baseband processing module 20 may employ a channel usage scheme to produce the outbound symbol stream. The channel usage scheme may be time division multiple access (TDMA), frequency divisional multiple access (FDMA), code division multiple access (CDMA), orthogonal frequency division multiplexing (OFDM), a combination thereof, and/or variations thereof.

The MMW front-end 22 converts the outbound symbol stream 32 into an outbound MMW signal 34 that is transmitted via the allocated communication resource(s) to another configurable logic block & MMW transceiver module (CXM) and/or to an I/O module.

The MMW transceiver, which may be representative of the MMW transceivers disclosed herein, includes the baseband processing module 20 and the MMW front-end 22 that includes a receiver section and a transmitter section. The transmitter and receiver sections may share one or more antennas or each may have its own one or more antennas.

The transmitter section converts the outbound symbol stream into an outbound MMW signal that has a carrier frequency within a given frequency band (e.g., 57-66 GHz, etc.). In an embodiment, this may be done by mixing the outbound symbol stream with a local oscillation to produce an up-converted signal. One or more power amplifiers and/or power amplifier drivers amplifies the up-converted signal, which may be MMW bandpass filtered, to produce the outbound MMQ signal.

In another embodiment, the transmitter section includes an oscillator that produces an oscillation. The outbound symbol stream provides phase information (e.g., $\pm\Delta\theta$ [phase shift] and/or $\theta(t)$ [phase modulation]) that adjusts the phase of the oscillation to produce a phase adjusted MMW signal, which is transmitted as the outbound MMW signal. In another embodiment, the outbound symbol stream includes amplitude information (e.g., $A(t)$ [amplitude modulation]), which is used to adjust the amplitude of the phase adjusted MMW signal to produce the outbound MMW signal.

In yet another embodiment, the transmitter section includes an oscillator that produces an oscillation. The outbound symbol provides frequency information (e.g., $\pm\Delta f$ [frequency shift] and/or $f(t)$ [frequency modulation]) that adjusts the frequency of the oscillation to produce a frequency adjusted MMW signal, which is transmitted as the outbound MMW signal. In another embodiment, the outbound symbol stream includes amplitude information, which is used to adjust the amplitude of the frequency adjusted MMW signal to produce the outbound MMW signal. In a further embodiment, the transmitter section includes an oscillator that produces an oscillation. The outbound symbol provides amplitude information (e.g., $\pm\Delta A$ [amplitude shift] and/or $A(t)$ [amplitude modulation]) that adjusts the amplitude of the oscillation to produce the outbound MMW signal.

The receiver section amplifies an inbound MMW signal to produce an amplified inbound MMW signal. The receiver section may then mix in-phase (I) and quadrature (Q) components of the amplified inbound MMW signal with in-phase and quadrature components of a local oscillation to produce a mixed I signal and a mixed Q signal. The mixed I and Q signals are combined to produce an inbound symbol stream. In this embodiment, the inbound symbol may include phase information (e.g., $\pm\Delta\theta$ [phase shift] and/or $\theta(t)$ [phase modulation]) and/or frequency information (e.g., $\pm\Delta f$ [frequency shift] and/or $f(t)$ [frequency modulation]). In another embodiment and/or in furtherance of the preceding embodiment, the inbound MMW signal includes amplitude information (e.g., $\pm\Delta A$ [amplitude shift] and/or $A(t)$ [amplitude modulation]). To recover the amplitude information, the receiver section includes an amplitude detector such as an envelope detector, a low pass filter, etc.

FIG. 3 is a schematic block diagram of another embodiment of a configurable logic block & MMW transceiver module (CXM) that includes a pair of configurable logic blocks (CLB) and a millimeter wave (MMW) transceiver (MMW XCVR). The MMW transceiver includes a baseband processing module 20 and a MMW front-end 22 as previously described with reference to FIG. 2.

As part of programming the programmable logic device, the configurable logic block & MMW transceiver module (CXM) receives a MMW configuration signal via at least one set up wireless communication resource. The MMW front-end converts the MMW configuration signal into an inbound symbol stream. The baseband processing module processes the inbound symbol stream to retrieve the configuration information, which includes one or more allocated communication resources and CLB configuration information to configure the switch matrixes of the CLBs. The baseband processing module stores the identity of the allocation communication resource(s) and provides respective CLB configuration information to each of the CLBs. Each of the CLBs configures itself in accordance with the respective CLB configuration information.

During execution of a programmed function, the MMW transceiver receives an MMW clock source signal (not shown) and generates at least one clock signal therefrom. The MMW transceiver provides the at least one clock signal to the CLBs. In addition, the MMW transceiver receives an inbound MMW signal, which includes input data for one or both of the CLBs. The MMW front-end converts the inbound MMW signal into an inbound symbol stream. The baseband processing module converts the inbound symbol stream into an input signal. The baseband processing module interprets the input signal to determine which CLB, or both of them, is to receive the input signal.

The CLB receiving the input signal performs its configured logical operation upon the input signal to produce an output signal. The baseband processing module determines whether the output signal is to be provided to the other CLB or wirelessly communicated to another CXM or I/O module. When the output signal is to be wirelessly communicated, the baseband processing module converts the output signal into an outbound symbol stream. The MMW front-end converts the outbound symbol stream into an outbound MMW signal that is transmitted via the allocated communication resource(s) to another configurable logic block & MMW transceiver module (CXM) and/or to an I/O module.

When the output signal is to be provided to the other CLB, the baseband processing module provides the output signal to the other CLB. The other CLB performs its configured logical operation upon the output signal of the first CLB to produce a second output signal. The MMW transceiver converts the second output signal into an outbound MMW signal that is transmitted via the allocated communication resource(s).

FIG. 4 is a schematic block diagram of another embodiment of a configurable logic block & MMW transceiver module (CXM) that includes a plurality of configurable logic blocks (CLB) and a millimeter wave (MMW) transceiver (MMW XCVR). The MMW transceiver includes a baseband processing module 20 and a MMW front-end 22 as previously described with reference to FIG. 2.

As part of programming the programmable logic device, the configurable logic block & MMW transceiver module (CXM) receives a MMW configuration signal via at least one set up wireless communication resource. The MMW front-end converts the MMW configuration signal into an inbound symbol stream. The baseband processing module processes the inbound symbol stream to retrieve configuration information, which includes one or more allocated communication resources and CLB configuration information to configure the switch matrixes of the CLBs. The baseband processing module stores the identity of the allocation communication resource(s) and provides respective CLB configuration information to each of the CLBs. Each of the CLBs configures itself in accordance with the respective CLB configuration information.

During execution of a programmed function, the MMW transceiver receives an MMW clock source signal (not shown) and generates at least one clock signal therefrom. The MMW transceiver provides the at least one clock signal to the CLBs. In addition, the MMW transceiver receives an inbound MMW signal, which includes input data for one or more of the CLBs. The MMW front-end converts the inbound MMW signal into an inbound symbol stream. The baseband processing module converts the inbound symbol stream into an input signal. The baseband processing module interprets the input signal to determine which of the CLBs is to receive the input signal.

The CLB receiving the input signal performs its configured logical operation upon the input signal to produce an output signal. The baseband processing module determines whether the output signal is to be provided to another CLB or wirelessly communicated to another CXM or I/O module. When the output signal is to be wirelessly communicated, the baseband processing module converts the output signal into an outbound symbol stream. The MMW front-end converts the outbound symbol stream into an outbound MMW signal that is transmitted via the allocated communication resource(s) to another configurable logic block & MMW transceiver module (CXM) and/or to an I/O module.

When the output signal is to be provided to another CLB, the baseband processing module provides the output signal to the other CLB. The other CLB performs its configured logical operation upon the output signal of the first CLB to produce a second output signal. The baseband processing module again determines whether the output signal is to be provided to another CLB or wirelessly communicated to another CXM or I/O module. This continues until the output signal is to be wirelessly communicated.

FIG. 5 is a schematic block diagram of an embodiment of an input/output module that includes an I/O block and a MMW transceiver (MMW XCVR). The MMW transceiver includes a baseband processing module 20 and a MMW front-end 22 that function similarly to the corresponding components of FIG. 2. The I/O block includes a plurality of I/O circuits that support one or more of a variety of I/O standards. The I/O circuits may be grouped into banks.

As part of programming the programmable logic device, the I/O module receives a MMW configuration signal 25 via at least one set up wireless communication resource. The MMW front-end converts the MMW configuration signal 25 into an inbound symbol stream 46. The baseband processing module 20 processes the inbound symbol stream 46 to retrieve the configuration information, which includes one or more allocated communication resources and may further include I/O configuration information regarding a particular I/O standard to be supported. The baseband processing module 20 stores the identity of the allocation communication resource(s) and provides the I/O configuration information to the I/O block. The I/O block configures itself in accordance with the I/O configuration information.

During execution of a programmed function, the MMW transceiver receives an MMW clock source signal (not shown) and generates at least one clock signal 56 therefrom. The MMW transceiver provides the at least one clock signal 56 to the I/O block. Embodiments of a MMW transceiver generating the at least one clock signal are described with reference to FIGS. 18 and 19.

In addition, the MMW transceiver receives an inbound MMW signal 44, which includes input data for the associated I/O block. The MMW front-end 22 converts the inbound MMW signal 44 into an inbound symbol stream 46. The baseband processing module 20 converts the inbound symbol stream 46 into an input signal 48. The I/O block receives the input signal 48 and provides it as a data output signal to a component or device that is external of the programmable logic device.

The I/O block also receives, as a data input signal from a component or device that is external of the programmable logic device, an output signal 50 that it provides to the baseband processing module 20. The baseband processing module 20 converts the output signal 50 into an outbound symbol stream 52. The MMW front-end 22 converts the outbound symbol stream 52 into an outbound MMW signal 54 that is transmitted via the allocated communication resource(s) to a configurable logic block & MMW transceiver module (CXM) and/or to another I/O module.

FIG. 6 is a schematic block diagram of another embodiment of an input/output module includes a pair of I/O blocks and a MMW transceiver (MMW XCVR). The MMW transceiver includes a baseband processing module 20 and a MMW front-end 22 that function similarly to the corresponding components of FIG. 2. Each of the I/O blocks includes a plurality of I/O circuits that support one or more of a variety of I/O standards and that may be grouped into banks.

As part of programming the programmable logic device, the I/O module receives a MMW configuration signal via at least one set up wireless communication resource. The MMW front-end converts the MMW configuration signal into an inbound symbol stream. The baseband processing module processes the inbound symbol stream to retrieve the configuration information, which includes one or more allocated communication resources and I/O configuration information to configure the I/O blocks. The baseband processing module stores the identity of the allocation communication resource(s) and provides respective I/O configuration information to each of the I/O blocks. Each of the I/O blocks configures itself in accordance with the respective I/O configuration information.

During execution of a programmed function, the MMW transceiver receives an MMW clock source signal (not shown) and generates at least one clock signal therefrom. The MMW transceiver provides the at least one clock signal to the I/O blocks. In addition, the MMW transceiver receives an inbound MMW signal, which includes input data for one or both of the I/O blocks. The MMW front-end converts the inbound MMW signal into an inbound symbol stream. The baseband processing module converts the inbound symbol stream into an input signal. The baseband processing module interprets the input signal to determine which of the I/O blocks is to receive the input signal. The I/O block receiving the input signal performs its configured I/O standard and outputs is as a data output.

In addition, one or both of the I/O blocks receives an external input that it (they) convert into an output signal. The baseband processing module determines whether the output signal is to be provided to the other I/O block or wirelessly communicated to a CXM or another I/O module. When the output signal is to be wirelessly communicated, the baseband processing module converts the output signal into an outbound symbol stream. The MMW front-end converts the outbound symbol stream into an outbound MMW signal that is transmitted via the allocated communication resource(s) to a configurable logic block & MMW transceiver module (CXM) and/or to another I/O module.

When the output signal is to be provided to the other I/O block, the baseband processing module provides the output signal to the other I/O block. The other I/O block performs its configured I/O standard upon the output signal to produce a second external output data signal.

FIG. 7 is a schematic block diagram of another embodiment of an input/output module that includes a plurality of I/O blocks and a millimeter wave (MMW) transceiver (MMW XCVR). The MMW transceiver includes a baseband processing module 20 and a MMW front-end 22 as previously described with reference to FIG. 2.

As part of programming the programmable logic device, the MMW transceiver receives a MMW configuration signal via at least one set up wireless communication resource. The MMW front-end converts the MMW configuration signal into an inbound symbol stream. The baseband processing module processes the inbound symbol stream to retrieve configuration information, which includes one or more allocated communication resources and I/O configuration information to configure the I/O blocks. The baseband processing module stores the identity of the allocation communication resource(s) and provides respective I/O configuration information to each of the I/O blocks. Each of the blocks configures itself in accordance with the respective I/O configuration information.

During execution of a programmed function, the MMW transceiver receives an MMW clock source signal (not shown) and generates at least one clock signal therefrom. The MMW transceiver provides the at least one clock signal to the I/O blocks. In addition, the MMW transceiver receives an inbound MMW signal, which includes input data for one or more of the I/O blocks. The MMW front-end converts the inbound MMW signal into an inbound symbol stream. The baseband processing module converts the inbound symbol stream into an input signal. The baseband processing module interprets the input signal to determine which of the I/O blocks is to receive the input signal. The I/O block receiving the input signal performs its configured I/O standard upon the input signal to produce an external output data signal, which is provides externally to the programmable logic device.

One or more of the I/O blocks also receives an external input data signal from a device or component external to the programmable logic device, which it converts in accordance with the programmed I/O standard into an output signal. The baseband processing module determines whether the output signal is to be provided to another I/O block or wirelessly communicated to a CXM or another I/O module. When the output signal is to be wirelessly communicated, the baseband processing module converts the output signal into an outbound symbol stream. The MMW front-end converts the outbound symbol stream into an outbound MMW signal that is transmitted via the allocated communication resource(s) to a CXM and/or to another I/O module. When the output signal is to be provided to another I/O block, the baseband processing module provides the output signal to the other I/O block.

Figure 8:
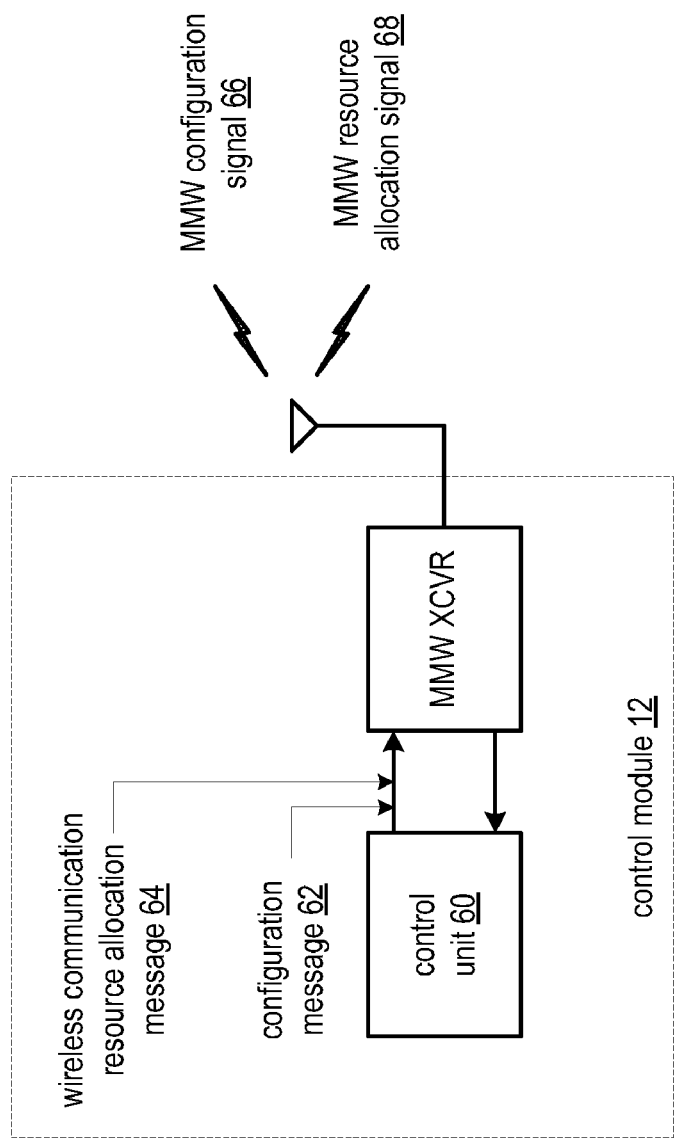
FIG. 8 is a schematic block diagram of an embodiment of a control module in accordance with the present invention.

FIG. 8 is a schematic block diagram of an embodiment of a control module 12 that includes a control unit 60 and a MMW transceiver (MMW XCVR). The MMW transceiver is of a similar construct as the MMW transceiver depicted in FIG. 2. The control unit 60 may be a single processing device or a plurality of processing devices. Such a processing device may be a microprocessor, micro-controller, digital signal processor, state machine, logic circuitry, analog circuitry, digital circuitry, and/or any device that manipulates signals (analog and/or digital) based on hard coding of the circuitry and/or operational instructions. The control unit 60 may have an associated memory and/or memory element, which may be a single memory device, a plurality of memory devices, and/or embedded circuitry of the control unit. Such a memory device may be a read-only memory, random access memory, volatile memory, non-volatile memory, static memory, dynamic memory, flash memory, cache memory, and/or any device that stores digital information. Note that when the control unit 60 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the control unit executes, hard coded and/or operational instructions corresponding to at least some of the steps and/or functions illustrated in FIGS. 1-21.

In an embodiment, the control unit identifies a set of the plurality of CXMs and the at least one of the plurality of input/output modules based on the programming instruction. The control unit 60 may receive the programming instruction via a connection to one of the plurality of I/O modules. Alternatively, the control unit 60 may receive the programming instruction via the MMW transceiver, which receives a MMW program signal from at least one of the plurality of input/output modules or from a transmitter external of the programmable logic device. The MMW transceiver converts the MMW program signal into the programming instruction and conveys the programming instruction to the control unit.

Upon receiving the programming instruction, the control unit 60 determines the configuration of the set of the plurality of CXMs and the at least one of input/output modules. For example, the control unit 60 determines how many CXMs and I/O modules are needed and determines, for each needed CXM and I/O module, how it is to be wirelessly connected to other CXMs and/or I/O modules. The control unit 60 then generates a configuration message 62 in accordance with the configuration. The MMW transceiver converts the configuration message 62 into a MMW configuration signal 66 and transmits it via at least one set-up wireless communication resource.

In addition, the control unit 60 determines the wireless communication resources needed to support the configuration and allocates the wireless communication resources accordingly. The control unit 60 then generates a wireless communication resource allocation message 64 in accordance with the allocation of the wireless communication resources (i.e., the message 64 identifies the communication resources being allocated to each needed CXM and I/O module and the up-stream and down-stream directions of wireless communications). The MMW transceiver converts the wireless communication resource allocation message 64 into a MMW resource allocation signal 68 and transmits it via at least one set-up wireless communication resource.

Figure 9:
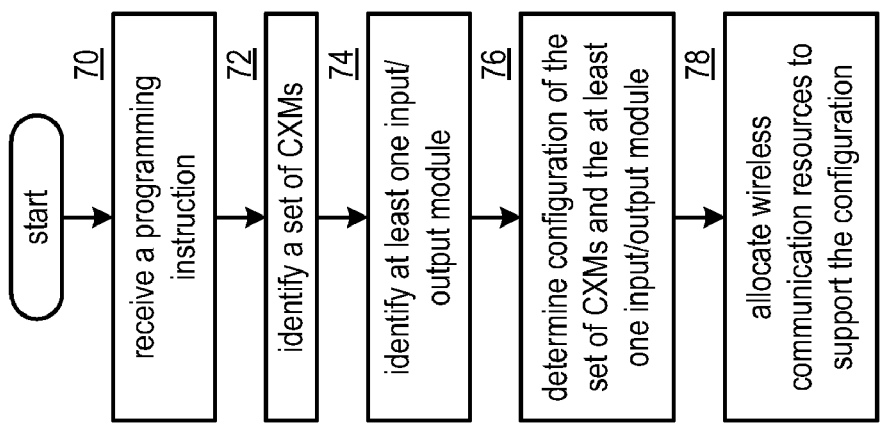
FIG. 9 is a logic diagram of an embodiment of a method performed by the control module in accordance with the present invention.

FIG. 9 is a logic diagram of an embodiment of a method performed by the control module that begins at step 70 where the control module receives a programming instruction. The programming instruction may be one of a plurality of programming instructions to configure the programmable logic device 10. The plurality of programming instructions may be generated from a netlist, which in turn may be generated from a program written in a hardware description language or from a schematic design. In addition, the control module 12 may receive the programming instruction via a wireless communication from one of the plurality of I/O modules or from an external transmitter. Alternatively, the control module 12 may receive the programming instruction via a connection to one of the plurality of I/O modules.

The method continues at step 72 where the control module 12 identifies a set of the plurality of CXMs based on the programming instruction as previously discussed. The method continues at step 74 where the control module 12 identifies at least one of the plurality of input/output modules based on the programming instruction as previously discussed.

The method then continues at step 76 where the control module 12 determines configuration of the set of the plurality of CXMs and the at least one of input/output modules in accordance with the programming instruction. The method continues at step 78 where the control module 12 allocates wireless communication resources of the programmable logic device to support the configuration of the set of the plurality of CXMs and the at least one of the plurality of input/output modules.

Figure 10:
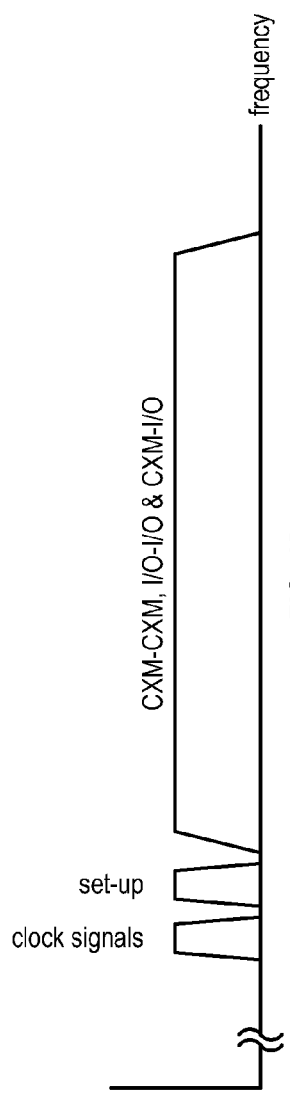
FIG. 10 is a diagram of an example of wireless communication resources in accordance with the present invention.

FIG. 10 is a diagram of an example of wireless communication resources that span one or more frequency bands. The frequency bands may be in the range of 56 GHz to 66 GHz or other range of frequencies up to about 300 GHz. In this example, the available frequency spectrum is divided into three regions: one for clock signals, one or set-up, and the third for configured communications between CXMs, CXMs and I/O modules, and/or between I/O modules. Each divided frequency spectrum may include one or more communication channels, where each channel may be further divided into frequency slots, time slots, and/or code slots.

In this example, each divided frequency spectrum includes at least one communication resource (e.g., a channel or a slot of a channel), which the control module may allocate to support the configuration of the configurable logic device. For instance, the clock signal frequency spectrum may include multiple channels that each support different clock signals. Similarly, the set-up frequency spectrum may be divided into multiple communication resources (e.g., channels or slots) to support set-up (e.g., programming of the programmable logic device), system level functions, and/or other overhead functions.

The third region includes a plurality of channels where at least some of the channels are subdivided into time slots, frequency slots, and/or code slots, which the control module allocates to support communications between configured CXMs and I/O modules. The control unit may employ a re-use pattern of the communication resources for sections of the programmable logic device 10 that are sufficiently isolated. For example, if the programmable logic device 10 is implemented on an integrated circuit, a 3, 5, or 7 cell re-use pattern may be employed. Alternatively, the integrated circuit may include shielding to provide isolation that enables frequency re-use.

Figure 11:
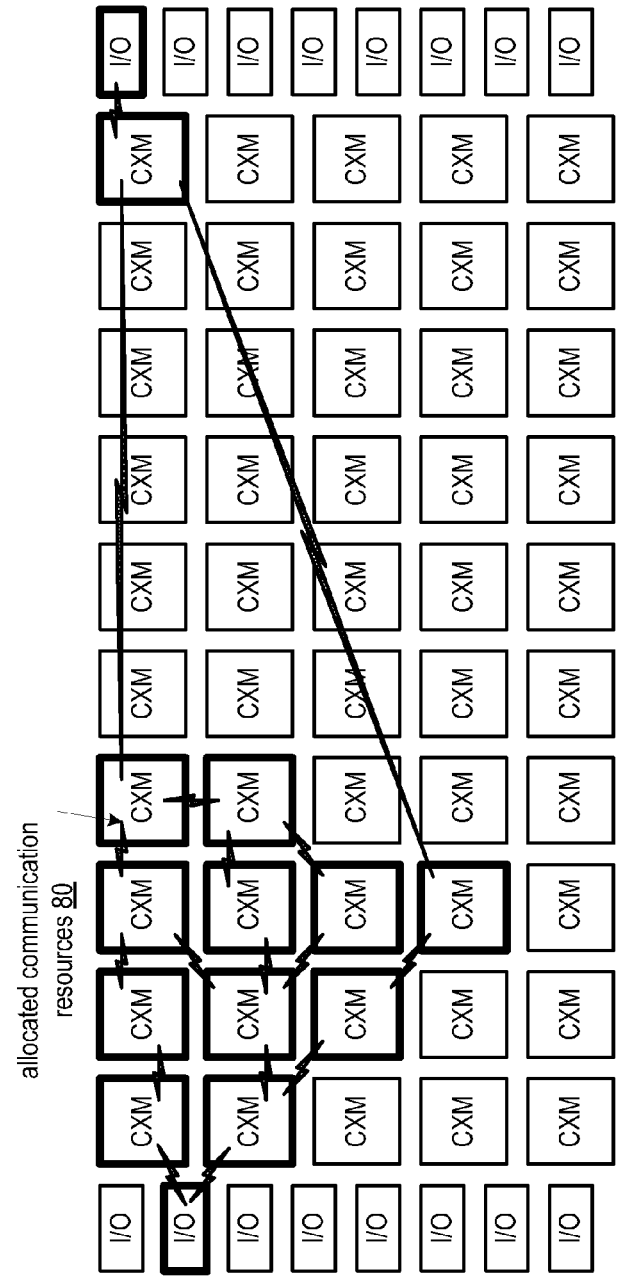
FIG. 11 is a schematic block diagram of an example of configuring a portion of the programmable logic device in accordance with the present invention.

FIG. 11 is a schematic block diagram of an example of configuring a portion of the programmable logic device 10 that includes a plurality of configurable logic blocks & MMW transceivers (CXM) and a plurality of I/O modules. In this example, the CXMs and the I/O modules that have bold lines have been identified to support a programmed function (e.g., Boolean equation, logic function, combinational logic, memory, etc.) and the control module has allocated wireless communication resources 80 for the select modules as indicated by the lightning bolt symbols.

As shown in this example, the wireless communication resources may wirelessly connect adjacent CXMs and/or connect CXMs across the programmable logic device 10. In addition the allocating wireless communication resources, the control unit may prescribe a transmit power for a CXM or I/O module to use. For instance, the transmit power from an CXM to an adjacent CXM can be significantly less than when the wireless communication link spans the programmable logic device 10.

Figure 12:
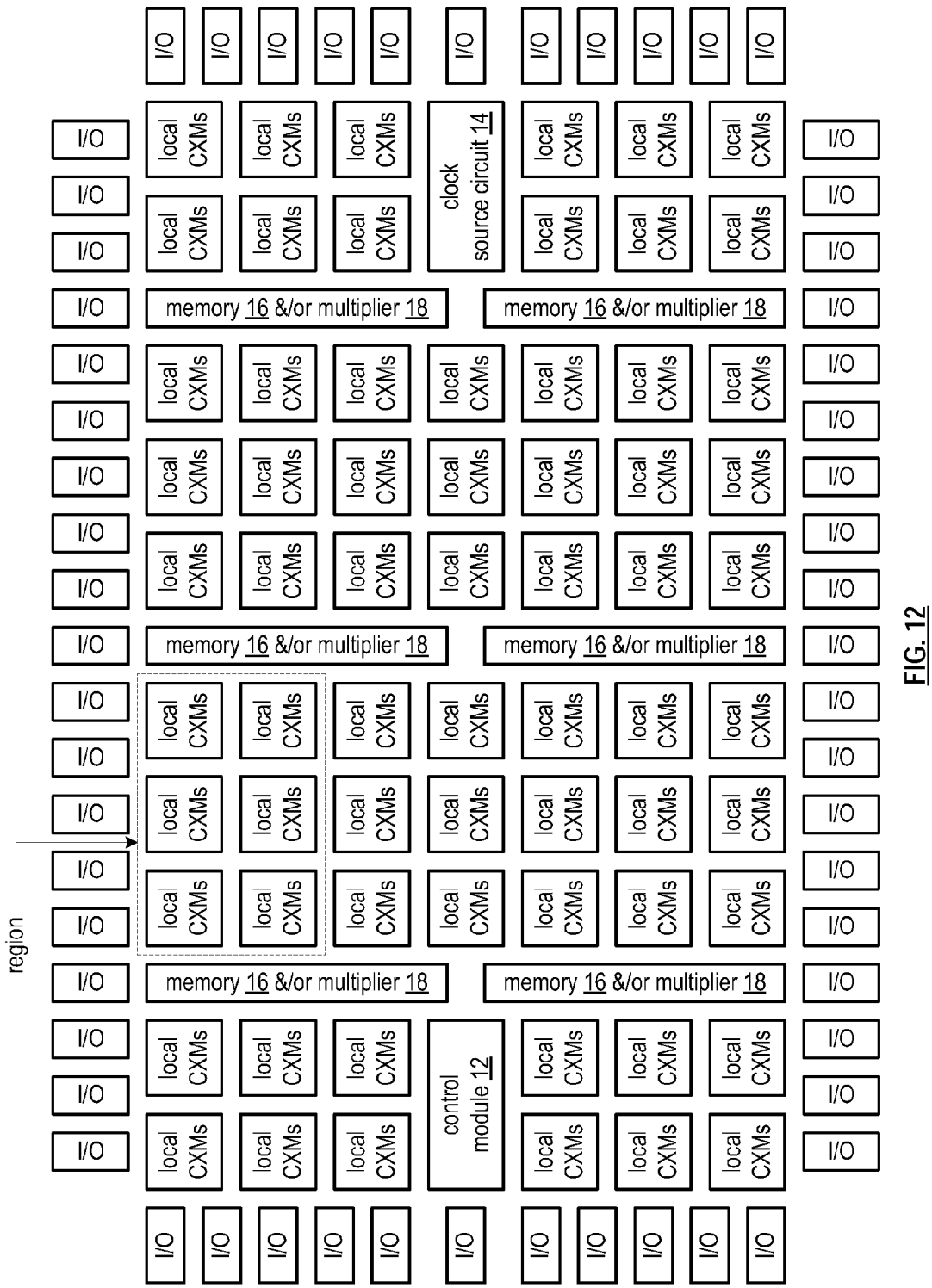
FIG. 12 is a schematic block diagram of another embodiment of a programmable logic device in accordance with the present invention.

FIG. 12 is a schematic block diagram of another embodiment of a programmable logic device that includes a plurality of local CXMs (configurable logic blocks & MMW transceivers), a plurality of I/O modules, a control module 12, a clock source circuit 14, and a plurality of memories 16 and/or multipliers 18. Each of the plurality of local CXMs includes a plurality of CXMs. In addition, a group of local CXMs may be grouped into a region.

The clock source circuit 14, which may be a separate module or embedded within the control module, generates one or more oscillations that are transmitted throughout, or to different sections of, the programmable logic device. Each of the modules (CXM, I/O, memory, and/or multipliers) receives at least one of the oscillations and generates one or more clock signals therefrom. A more detailed discussion of generating the oscillation and recovering a clock signal therefrom is provided with reference to FIG. 18.

The programmable logic device may further include a plurality of repeaters distributed throughout the device to repeat wireless communications between modules. In addition, one or more repeaters may be used to repeat the MMW oscillation signal(s) generated by the clock source circuit 14. The repeaters may use the same carrier frequency of the signal it is repeating or a different carrier frequency.

Figure 13:
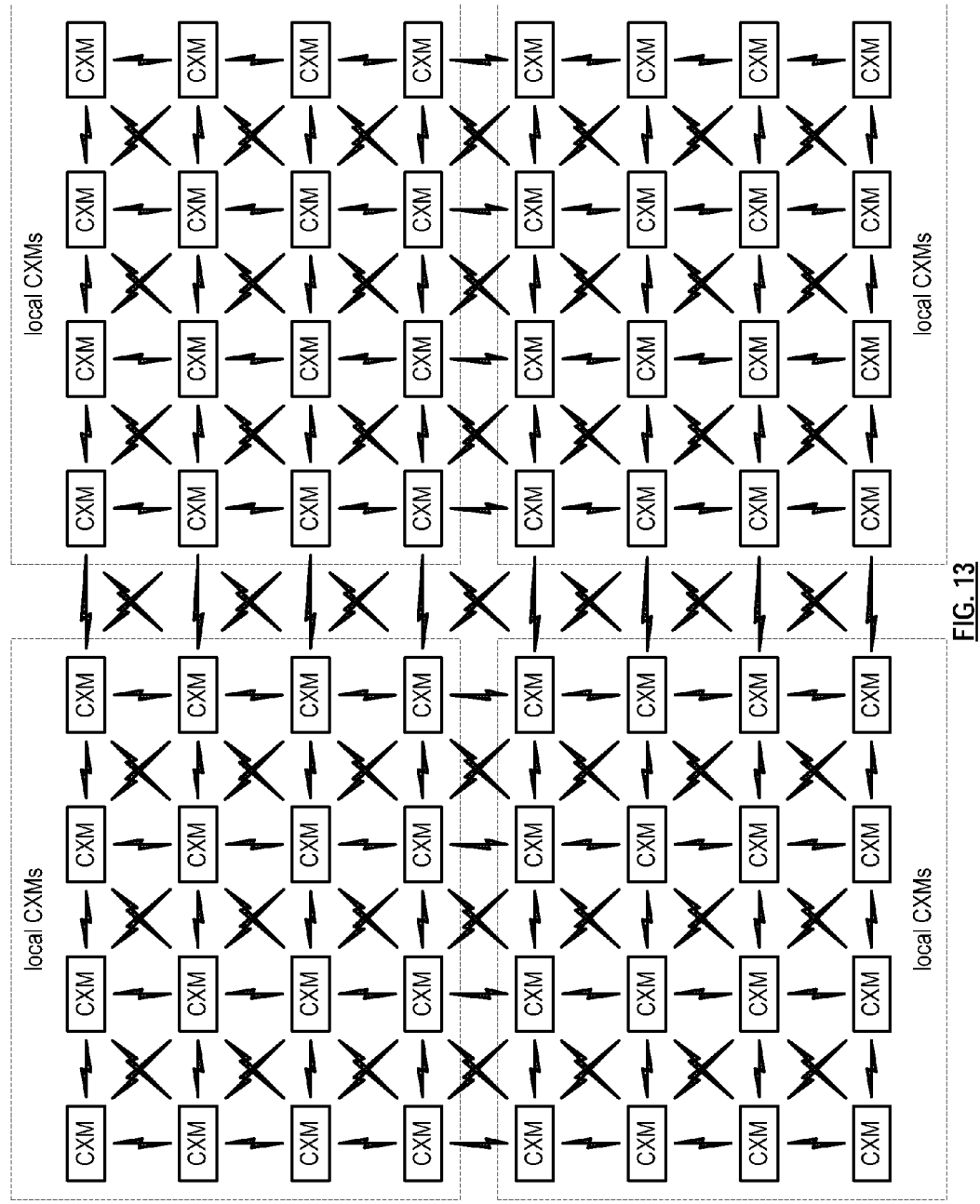
FIG. 13 is a schematic block diagram of an embodiment of a plurality of local CXMs (configurable logic block & MMW transceiver module) in accordance with the present invention.

FIG. 13 is a schematic block diagram of an embodiment of a plurality of local CXMs (configurable logic block & MMW transceiver module) that may make up a region of the programmable logic device. Each local CXM includes a plurality of CXMs. Each of the CXMs (embodiments of which have been described with reference to FIGS. 2-4) may wirelessly communicate with one or more of its adjacent neighbors, with CXMs in different local CXMs, and/or with CXMs in different regions of the programmable logic device.

Each wireless communication between CXMs is allocated a different wireless communication resource. Thus, in this example, each CXM may utilize multiple wireless communication resources to wirelessly communicate with multiple other CXMs.

Figure 14:
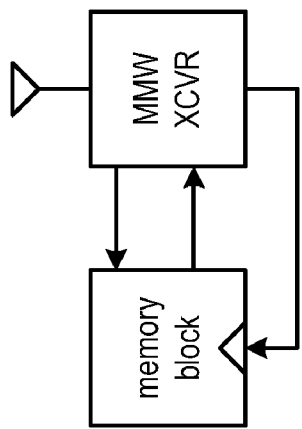
FIG. 14 is a schematic block diagram of an embodiment of a memory module in accordance with the present invention.

FIG. 14 is a schematic block diagram of an embodiment of a memory module 16 that includes a memory block and a MMW transceiver (MMW XCVR). The memory block may be one or more memory devices. Such a memory device may be a read-only memory, random access memory, volatile memory, non-volatile memory, static memory, dynamic memory, flash memory, cache memory, and/or any device that stores digital information. The MMW transceiver includes a baseband processing module and a MMW front-end similar to the corresponding components of the MMW transceiver of FIG. 2.

As part of programming the programmable logic device, the memory module 16 receives a MMW configuration signal via at least one set up wireless communication resource. The MMW front-end converts the MMW configuration signal into an inbound symbol stream. The baseband processing module processes the inbound symbol stream to retrieve the configuration information, which includes one or more allocated communication resources for the memory module. The baseband processing module stores the identity of the allocation communication resource(s).

During execution of a programmed function, the MMW transceiver receives an MMW clock source signal (not shown) and generates at least one clock signal therefrom. The MMW transceiver provides the at least one clock signal to the memory block. In addition, the MMW transceiver receives an inbound MMW signal, which includes a memory read or memory write command for the associated memory block. The MMW front-end 22 converts the inbound MMW signal into an inbound symbol stream. The baseband processing module 20 converts the inbound symbol stream into an input signal (e.g., a memory read or memory write command).

The memory block receives the memory read command or the write command. For a write command, the memory block stores the corresponding data. For a read command, the memory block retrieves the requested data and provides it the baseband processing module as an output signal. The baseband processing module converts the output signal into an outbound symbol stream. The MMW front-end converts the outbound symbol stream into an outbound MMW signal that is transmitted via the allocated communication resource(s) to a configurable logic block & MMW transceiver module (CXM), another memory module 16, a multiplier module 18, and/or to an I/O module.

Figure 15:
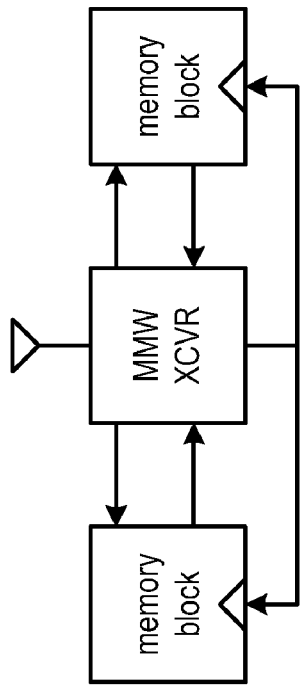
FIG. 15 is a schematic block diagram of another embodiment of a memory module in accordance with the present invention.

FIG. 15 is a schematic block diagram of another embodiment of a memory module 16 that includes a plurality of memory blocks (only two shown) and a MMW transceiver. The MMW transceiver includes a baseband processing module 20 and a MMW front-end 22 as previously described with reference to FIG. 2.

As part of programming the programmable logic device, the memory module 16 receives a MMW configuration signal via at least one set up wireless communication resource. The MMW front-end converts the MMW configuration signal into an inbound symbol stream. The baseband processing module processes the inbound symbol stream to retrieve configuration information, which includes one or more allocated communication resources. The baseband processing module stores the identity of the allocation communication resource(s).

During execution of a programmed function, the MMW transceiver receives an MMW clock source signal (not shown) and generates at least one clock signal therefrom. The MMW transceiver provides the at least one clock signal to the memory blocks. In addition, the MMW transceiver receives an inbound MMW signal, which includes a read command or a write command for one or more of the memory blocks. The MMW front-end converts the inbound MMW signal into an inbound symbol stream. The baseband processing module converts the inbound symbol stream into a read command or a write command. The baseband processing module interprets the command to determine which of the memory blocks is to receive the command.

For a write command, the memory block receiving the command stores the corresponding data. For a read command, the memory block receiving the command retrieves the requested data and provides it the baseband processing module as an output signal. The baseband processing module converts the output signal into an outbound symbol stream. The MMW front-end converts the outbound symbol stream into an outbound MMW signal that is transmitted via the allocated communication resource(s) to a configurable logic block & MMW transceiver module (CXM), another memory module 16, a multiplier module 18, and/or to an I/O module.

Figure 16:
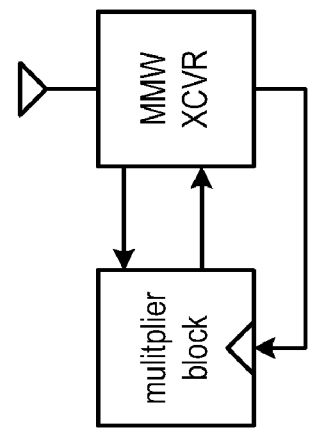
FIG. 16 is a schematic block diagram of an embodiment of a multiplier module in accordance with the present invention.

FIG. 16 is a schematic block diagram of an embodiment of a multiplier module 18 that includes a multiplier block and a MMW transceiver. The multiplier may be one or more integer multipliers and/or floating point multipliers. The MMW transceiver includes a baseband processing module and a MMW front-end similar to the corresponding components of the MMW transceiver of FIG. 2.

As part of programming the programmable logic device, the multiplier module 18 receives a MMW configuration signal via at least one set up wireless communication resource. The MMW front-end converts the MMW configuration signal into an inbound symbol stream. The baseband processing module processes the inbound symbol stream to retrieve the configuration information, which includes one or more allocated communication resources for the multiplier module. The baseband processing module stores the identity of the allocation communication resource(s).

During execution of a programmed function, the MMW transceiver receives an MMW clock source signal (not shown) and generates at least one clock signal therefrom. The MMW transceiver provides the at least one clock signal to the multiplier block. In addition, the MMW transceiver receives an inbound MMW signal, which includes two operands for the associated memory block. The MMW front-end 22 converts the inbound MMW signal into an inbound symbol stream. The baseband processing module 20 converts the inbound symbol stream into an input signal (e.g., the two operands).

The multiplier block receives the two operands and multiplies them to produce a product. The multiplier block provides the product to the baseband processing module as an output signal. The baseband processing module converts the output signal into an outbound symbol stream. The MMW front-end converts the outbound symbol stream into an outbound MMW signal that is transmitted via the allocated communication resource(s) to a configurable logic block & MMW transceiver module (CXM), a memory module 16, another multiplier module 18, and/or to an I/O module.

Figure 17:
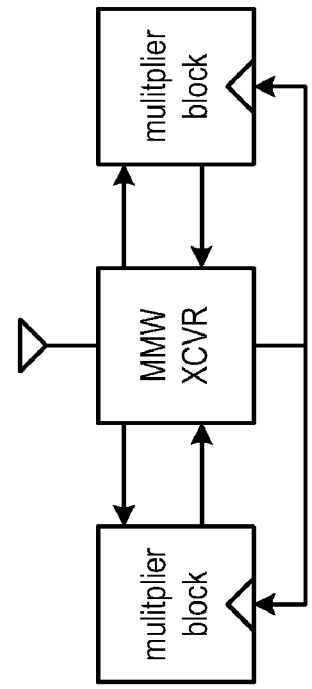
FIG. 17 is a schematic block diagram of another embodiment of a multiplier module in accordance with the present invention.

FIG. 17 is a schematic block diagram of another embodiment of a multiplier module 18 that includes a plurality of multiplier blocks (only two shown) and a MMW transceiver. The MMW transceiver includes a baseband processing module 20 and a MMW front-end 22 as previously described with reference to FIG. 2.

As part of programming the programmable logic device, the multiplier module 18 receives a MMW configuration signal via at least one set up wireless communication resource. The MMW front-end converts the MMW configuration signal into an inbound symbol stream. The baseband processing module processes the inbound symbol stream to retrieve configuration information, which includes one or more allocated communication resources. The baseband processing module stores the identity of the allocation communication resource(s).

During execution of a programmed function, the MMW transceiver receives an MMW clock source signal (not shown) and generates at least one clock signal therefrom. The MMW transceiver provides the at least one clock signal to the multiplier blocks. In addition, the MMW transceiver receives an inbound MMW signal, which includes operands (e.g., two for each addressed multiplier block). The MMW front-end converts the inbound MMW signal into an inbound symbol stream. The baseband processing module converts the inbound symbol stream into the two operands. The baseband processing module interprets the inbound symbol stream to determine which of the multiplier blocks is to receive the operands.

Each addressed multiplier block receives two operands and multiplies them to produce a product. The multiplier block provides the product to the baseband processing module as an output signal. The baseband processing module converts the output signal into an outbound symbol stream. The MMW front-end converts the outbound symbol stream into an outbound MMW signal that is transmitted via the allocated communication resource(s) to a configurable logic block & MMW transceiver module (CXM), a memory module 16, another multiplier module 18, and/or to an I/O module.

Figure 18:
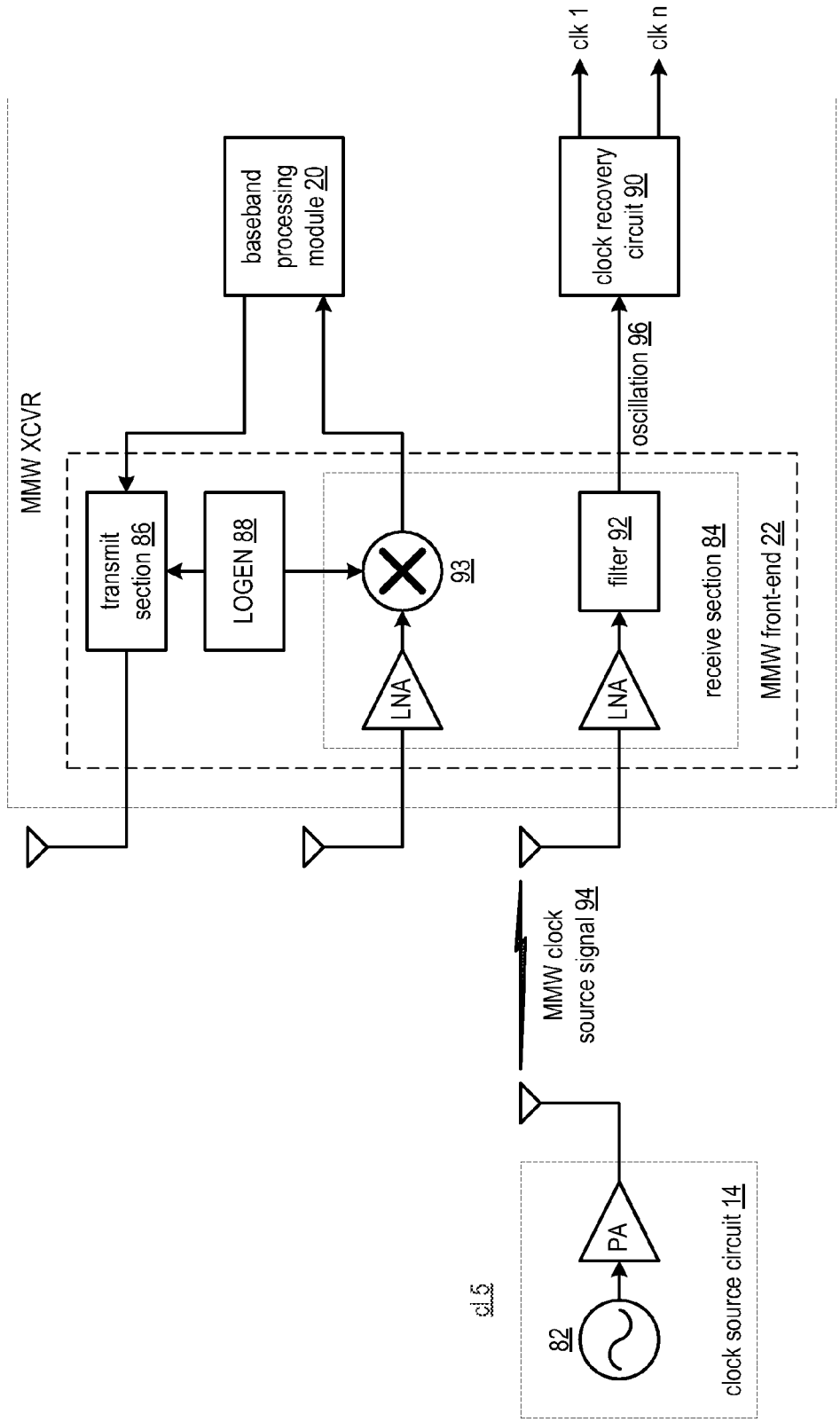
FIG. 18 is a schematic block diagram of an embodiment of a clock source circuit and a MMW transceiver in accordance with the present invention.

FIG. 18 is a schematic block diagram of an embodiment of a clock source circuit 14 and a MMW transceiver (MMW XCVR). The clock source circuit 14 includes an oscillation module 82 and a MMW transmitter section (e.g., a power amplifier (PA) and at least one antenna). The MMW transceiver includes the baseband processing module 20, the MMW front-end 22, and a clock recovery circuit 90. The MMW front-end 22 includes a receive section 84, a transmit section 86, and a local oscillation generator (LOGEN) 88. The receive section 84 includes two low noise amplifiers (LNA), a filter 92, and a mixing module 93.

The oscillation module 82, which may be an oscillator, a voltage controlled oscillator, a phase locked loop or other oscillating circuit, generates at least one oscillation. The oscillation may be sinusoidal, a square wave, a triangular wave, or other repetitive shape having a desired frequency (e.g., 56-65 GHz). The power amplifier (PA) amplifies the oscillation that is transmitted via the at least one antenna as a MMW clock source signal 94. Note that the clock source circuit 14 may continuously generate the MMW clock source signal 94 as needed to support operation of a programmed section of the programmable logic device.

A LNA receives and amplifies the MMW clock signal 94 to produce an amplified MMW clock source signal. The filter 92, which may be a bandpass filter, filters the amplified MMW clock source signal to recapture the oscillation 96. The clock recovery circuit 90 (which may be a phase locked loop, frequency dividers, and/or frequency multipliers) generates one or more clock signals (e.g., clk 1 through clk n) from the oscillation. The remainder of the receive section 84 functions as previously described to convert an inbound MMW signal into an inbound symbol stream.

Figure 19:
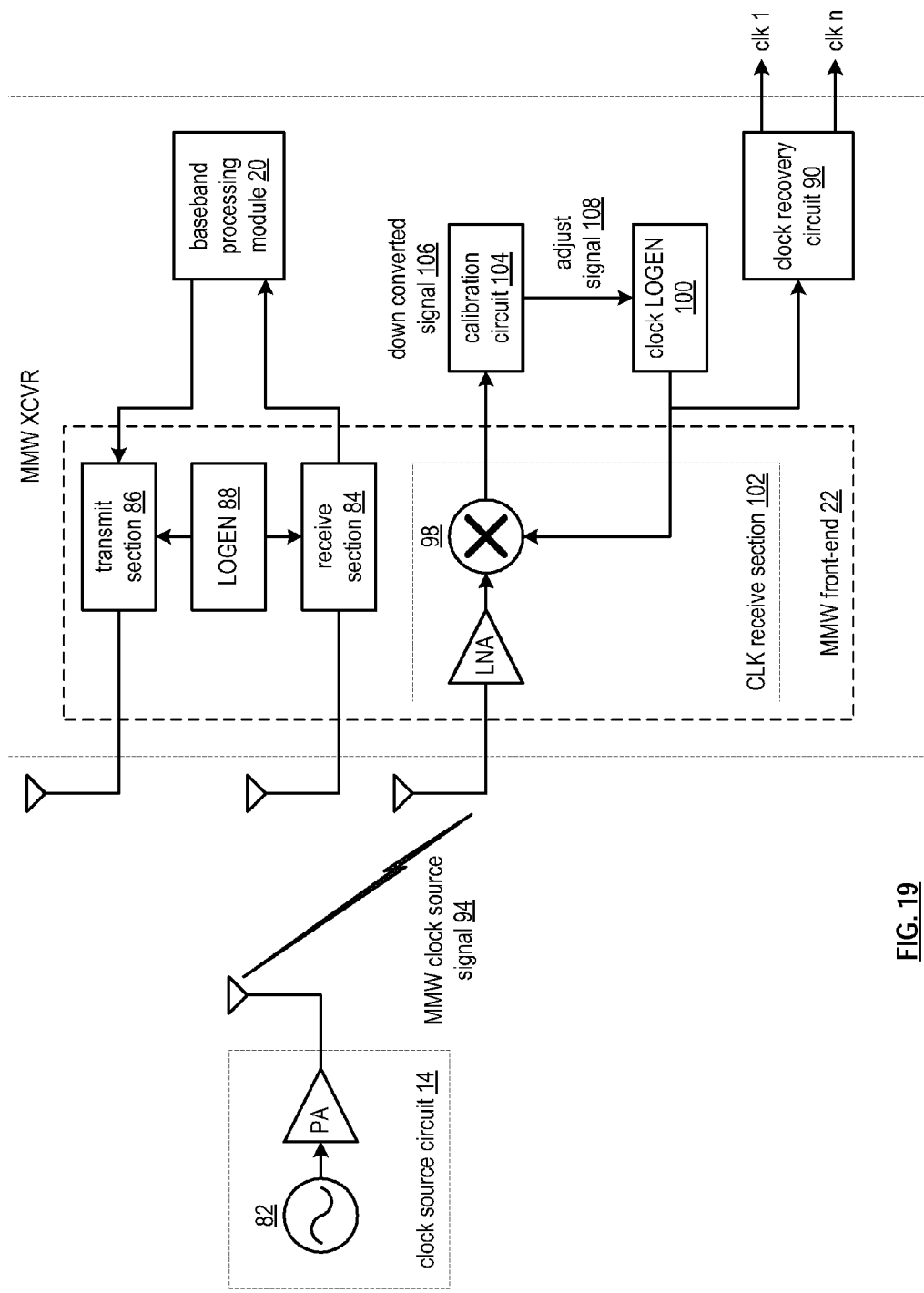
FIG. 19 is a schematic block diagram of another embodiment of a clock source circuit and a MMW transceiver in accordance with the present invention.

FIG. 19 is a schematic block diagram of another embodiment of a clock source circuit 14 and a MMW transceiver (MMW XCVR). The clock source circuit 14 includes an oscillation module 82 and a MMW transmitter section (e.g., a power amplifier (PA) and at least one antenna). The MMW transceiver includes the baseband processing module 20, the MMW front-end 22, a clock recovery circuit 90, and a calibration circuit 104. The MMW front-end 22 includes a receive section 84, a transmit section 86, a local oscillation generator (LOGEN) 88, a clock LOGEN 100, and a clock (CLK) receive section 102. The CLK receive section 82 includes a low noise amplifier (LNA) and a mixing module 98. The transmitter section 86, the receiver section 84, and the baseband processing module 20 function as previously discussed.

In this embodiment, the LNA receives and amplifies the MMW clock signal 94 to produce an amplified MMW clock source signal. The mixing module 98, which may include a mixer and a filter, mixes the amplified MMW clock source signal with a clock reference oscillation produced by the clock LOGEN 100 to produce a down converted signal. The calibration circuit 104 generates an adjust signal 108 based on the down converted signal. For example, if the down converted signal is not centered at baseband, the calibration circuit 104 generates the adjust signal, which is fed to the clock local oscillation generator 100 to adjust the clock reference oscillation such that the down converted signal is centered at baseband.

The clock recovery circuit 90 (which may be a phase locked loop, frequency dividers, and/or frequency multipliers) generates one or more clock signals (e.g., clk 1 through clk n) from the oscillation produced by the clock LOGEN. In this manner, the oscillation produced by the clock LOGEN is adjusted to substantially match the oscillation produced by the oscillation module 82.

Figure 20:
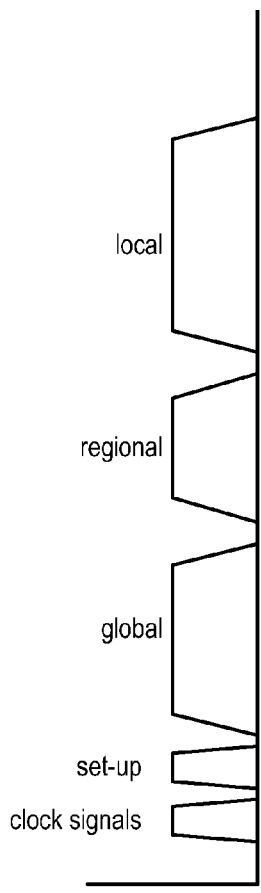
FIG. 20 is a diagram of another example of wireless communication resources in accordance with the present invention.

FIG. 20 is a diagram of another example of wireless communication resources that span one or more frequency bands. The frequency bands may be in the range of 56 GHz to 66 GHz or other range of frequencies up to about 300 GHz. In this example, the available frequency spectrum is divided into five regions: one for clock signals, one or set-up, a third for global communications, a fourth for regional communications, and a fifth for local communications. Each divided frequency spectrum may include one or more communication channels, where each channel may be further divided into frequency slots, time slots, and/or code slots.

In this example, each divided frequency spectrum includes at least one communication resource (e.g., a channel or a slot of a channel), which the control module may allocate to support the configuration of the configurable logic device. For instance, the clock signal frequency spectrum may include multiple channels that each support different clock signals. Similarly, the set-up frequency spectrum may be divided into multiple communication resources (e.g., channels or slots) to support set-up (e.g., programming of the programmable logic device), system level functions, and/or other overhead functions.

The global frequency spectrum includes a plurality of channels where at least some of the channels are subdivided into time slots, frequency slots, and/or code slots, which the control module allocates to support global communications (e.g., across region boundaries—see FIG. 12) between configured CXMs and I/O modules. The regional frequency spectrum includes a plurality of channels where at least some of the channels are subdivided into time slots, frequency slots, and/or code slots, which the control module allocates to support regional communications (e.g., within region boundaries and across local boundaries) between configured CXMs and I/O modules. The local frequency spectrum includes a plurality of channels where at least some of the channels are subdivided into time slots, frequency slots, and/or code slots, which the control module allocates to support local communications (e.g., with local boundaries) between configured CXMs and I/O modules.

The control unit may employ a re-use pattern of the communication resources within the regional frequency spectrum and/or within the local frequency spectrum. For example, if the programmable logic device is implemented on an integrated circuit, a 3, 5, or 7 cell re-use pattern may be employed for the local or regional frequency spectrums. Alternatively, the integrated circuit may include shielding to provide isolation that enables frequency re-use.

Figure 21:
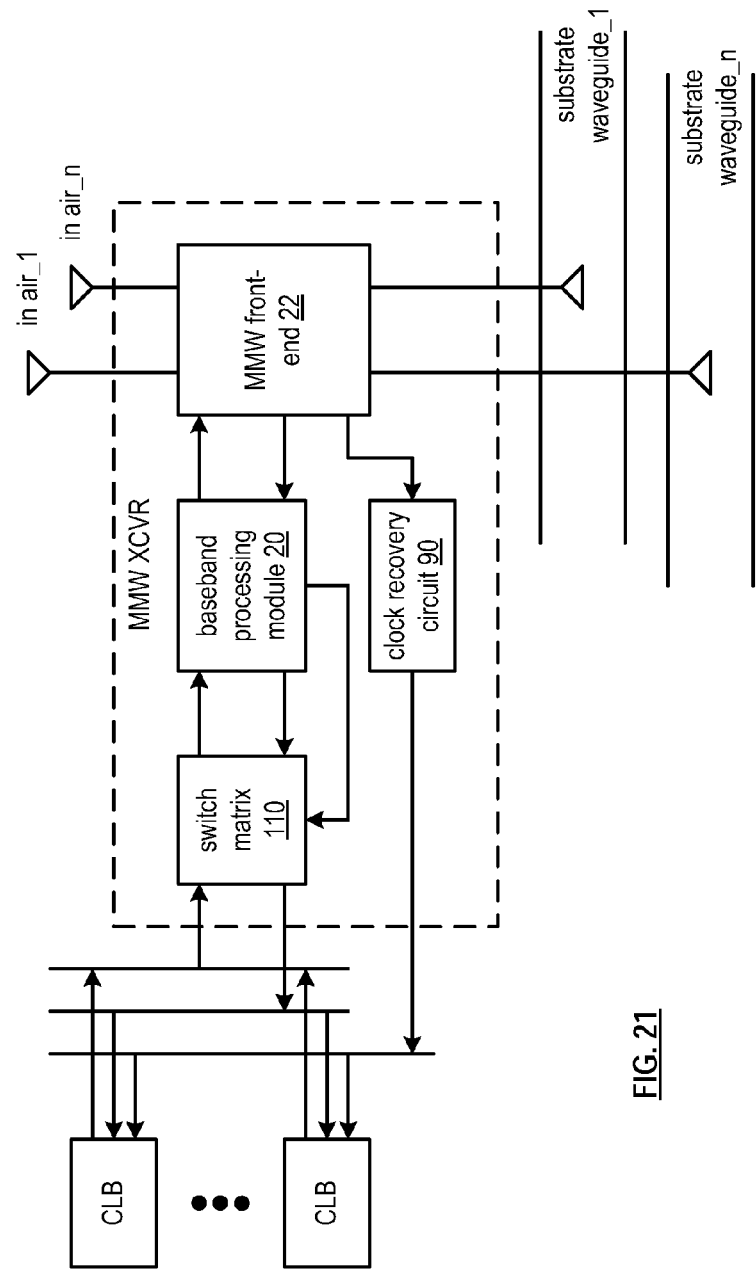
FIG. 21 is a schematic block diagram of another embodiment of a configurable logic block & MMW transceiver module in accordance with the present invention.

FIG. 21 is a schematic block diagram of another embodiment of a configurable logic block & MMW transceiver module (CXM) that includes a plurality of CLBs and a MMW transceiver (MMW XCVR). The MMW XCVR includes the baseband processing module 20, the MMW front-end 22, the clock recovery circuit 90, and a switch matrix 110. The switch matrix 110, as directed by the baseband processing module, couples the input or the output of a configurable logic block to the input or the output of another configurable logic block.

In this embodiment, the MMW front-end 22 is coupled to a plurality of antennas (only four shown) and may include a plurality of transmit sections and receive sections. Each antenna provides a different wireless communication link for the MMW transceiver. For instance, two of the antennas transmit or receive their respective MMW signals via the air and the other antennas transmit or receiver their respective MMW signals via a substrate waveguide. For instance, one substrate waveguide may be used to support local communications and another used to support regional communications.

FIG. 22 is a schematic block diagram of another embodiment of a configurable logic device 120 that includes a plurality of input/output modules and a plurality of configurable logic and millimeter wave (MMW) transceiver modules (CXM). Embodiments of the CXM are provided in FIGS. 2-4, 18, 19 and 21 and embodiments of an I/O module are provided in FIGS. 5-7.

In this embodiment, in response to a programming instruction 122, a set of the plurality of CXMs and at least one of the plurality of input/output modules are wirelessly connected via one or more wireless communication resources. The programming instruction 122 may be received from a transmitter external to the programmable logic device via at least one set-up wireless communication resource. As such, the programming instruction is of an instruction set that embodies the wireless connectivity and flexibility of the programmable logic device.

The programmable logic device may further include a clock source circuit that includes an oscillation module and a MMW transmitter section. The oscillation module generates at least one oscillation. The MMW transmitter section transmit the at least one oscillation as at least one MMW clock source signal.

The programmable logic device may further include one or more memory modules, wherein a memory module of the one or more memory modules includes one or more memory blocks and a memory MMW transceiver. The programmable logic device may also include one or more multiplier modules, wherein a multiplier module of the one or more multiplier modules includes one or more multiplier blocks and a multiplier MMW transceiver.

In this embodiment, the programmable logic device may include a plurality of local CXMs and a plurality of regions. Where a region includes a set of the plurality of local CXMs and a local CXM includes a set of the plurality of CXMs. In this manner, wireless communication resources can be allocated based on location of a CXM within the programmable logic device. Note that the programmable logic device may include a plurality of wireless communication transmission mediums, wherein the programming instruction indicates allocation of a wireless communication transmission medium of the plurality of wireless communication transmission mediums for a wireless communication resource of the one or more wireless communication resources.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A programmable logic device comprises:
   a plurality of input/output modules;
   a plurality of configurable logic and millimeter wave (MMW) transceiver modules (CXM), wherein a CXM of the plurality of CXMs includes one or more configurable logic blocks and a MMW transceiver; and
   a control module, wherein the control module is operable to:
      receive a programming instruction;
      identify a set of the plurality of CXMs based on the programming instruction;
      identify at least one of the plurality of input/output modules based on the programming instruction;
      determine configuration of the set of the plurality of CXMs and the at least one of input/output modules in accordance with the programming instruction;
      generate a configuration message in accordance with the configuration;
      allocate wireless communication resources of the programmable logic device to support the configuration of the set of the plurality of CXMs and the at least one of the plurality of input/output modules;
      generate a wireless communication resource allocation message in accordance with the allocation of the wireless communication resources;
      convert the configuration message into a MMW configuration signal;
      convert the wireless communication resource allocation message into a MMW resource allocation signal; and
      transmit the MMW configuration signal and the MMW resource allocation signal via at least one set-up wireless communication resource.

2. The programmable logic device of claim 1 further comprises:
   a clock source circuit that includes:
      an oscillation module that generates at least one oscillation; and
      a MMW transmitter section coupled to transmit the at least one oscillation as at least one MMW clock source signals.

3. The programmable logic device of claim 1, wherein the control module comprises:
   a control unit operable to:
      identify the set of the plurality of CXMs and the at least one of the plurality of input/output modules based on the programming instruction;
      determine the configuration of the set of the plurality of CXMs and the at least one of input/output modules;
      generate the configuration message in accordance with the configuration;
      allocate the wireless communication resources to support the configuration of the set of the plurality of CXMs and the at least one of the plurality of input/output modules;
      generate the wireless communication resource allocation message in accordance with the allocation of the wireless communication resources; and
   a MMW transceiver operable to:
      convert the configuration message into the MMW configuration signal;
      convert the wireless communication resource allocation message into the MMW resource allocation signal; and
      transmit the MMW configuration signal and the MMW resource allocation signal via at least one set-up wireless communication resource.

4. The programmable logic device of claim 3 further comprises at least one of:
   the control unit coupled to at least one of the plurality of input/output modules to receive the programming instruction;
   the MMW transceiver coupled to:
      receive a MMW program signal from the at least one of the plurality of input/output modules;
      convert the MMW program signal into the programming instruction; and
      convey the programming instruction to the control unit.

5. The programmable logic device of claim 3, wherein the control module further comprises:
   a clock source circuit that includes:
      an oscillation module that generates at least one oscillation; and
      a MMW transmitter section coupled to transmit the at least one oscillation as at least one MMW clock source signals.

6. The programmable logic device of claim 1, wherein a configurable logic block of the one or more configurable logic blocks of the CXM includes an input, an output, and a clock input; and
   wherein the MMW transceiver of the CXM functions to:
      receive an inbound MMW signal;
      convert the inbound MMW signal into an input signal;
      convey the input signal to the input of at least one of the one or more configurable logic blocks;
      receive an output signal from the output of the at least one of the one or more configurable logic blocks; and
      convert the output signal into an outbound MMW signal.

7. The programmable logic device of claim 6, wherein the MMW transceiver comprises:
   a baseband processing module coupled to:
      convert an inbound symbol stream into the input signal; and
      convert the output signal into an outbound symbol stream;
   a MMW front-end coupled to:
      convert the inbound MMW signal into the inbound symbol stream;
      convert the outbound symbol stream into the outbound MMW signal;
      receive a MMW clock source signal; and convert the MMW clock source signal into an oscillation; and a clock recovery circuit coupled to convert the oscillation into a clock signal, wherein the clock recovery circuit conveys the clock signal to the clock input of the at least one of the one or more of the configurable logic blocks.

8. The programmable logic device of claim 7, wherein the MMW transceiver further comprises:

a switch matrix operable to couple the input or the output of a first one of the one or more configurable logic blocks to the input or the output of a second one of the one or more configurable logic blocks.

9. The programmable logic device of claim 7, the MMW front-end comprises:

a transmit section coupled to convert the inbound MMW signal into the inbound symbol stream based on a transmit local oscillation;

a receive section coupled to convert the outbound symbol stream into the outbound MMW signal based on a receive local oscillation;

a local oscillation generator coupled to generate the transmit and receive local oscillations;

a clock local oscillation generator coupled to generate a clock reference oscillation;

a clock receiver section coupled to convert the MMW clock source signal into a down converted signal based on the clock reference oscillation; and a calibration circuit coupled to generate an adjust signal based on the down converted signal, wherein the clock local oscillation generator adjusts the clock reference oscillation based on the adjust signal to produce the oscillation.

10. The programmable logic device of claim 1, wherein an input/output module of the plurality of input/output modules comprises:

one or more input/output (I/O) blocks, wherein an I/O block of the one or more I/O blocks includes a data input, and a data output, and a clock input; and a MMW transceiver coupled to the one or more I/O blocks, wherein the MMW transceiver functions to:
receive an inbound MMW signal;
convert the inbound MMW signal into an input signal;
convey the input signal to the input of at least one of the I/O blocks;
receive an output signal from the output of the at least one of the I/O blocks; and
convert the output signal into an outbound MMW signal.

11. The programmable logic device of claim 1 further comprises at least one of:

one or more memory modules, wherein a memory module of the one or more memory modules includes one or more memory blocks and a memory MMW transceiver; and one or more multiplier modules, wherein a multiplier module of the one or more multiplier modules includes one or more multiplier blocks and a multiplier MMW transceiver.

12. The programmable logic device of claim 1 further comprises:

a plurality of local CXMs, wherein a local CXM of the plurality of local CXMs includes a set of the plurality of CXMs;

a plurality of regions, wherein a region of the plurality of regions includes a set of the plurality of local CXMs, wherein a wireless communication resource of the wireless communication resources includes at least one of a division multiple access slot and a channel of a frequency band, wherein the wireless communication resources are partitioned into a frequency band section for clock source signals communications, a frequency band for set-up communications, a frequency band section for communications within the local CXM, a frequency band section for communications within the region, and a frequency band for communications between two or more of the plurality of regions.

13. The programmable logic device of claim 1 further comprises:

a plurality of wireless communication transmission mediums, wherein the control module allocates a wireless communication transmission medium of the plurality of wireless communication transmission mediums for a wireless communication resource of the wireless communication resources allocated to support the configuration.

14. A programmable logic device comprises:

a plurality of input/output modules;

a plurality of configurable logic and millimeter wave (MMW) transceiver modules (CXM), wherein a CXM of the plurality of CXMs includes one or more configurable logic blocks and a MMW transceiver; and a control module operable to:
determine configuration of a set of the plurality of CXMs and at least one of input/output modules in accordance with a programming instruction;
generate a configuration message in accordance with the configuration;
allocate wireless communication resources of the programmable logic device to support the configuration of the set of the plurality of CXMs and the at least one of the plurality of input/output modules; and
generate a MMW configuration signal and a MMW resource allocation signal for transmission via at least one set-up wireless communication resource.

15. The programmable logic device of claim 14 further comprises:

a clock source circuit that includes:
an oscillation module that generates at least one oscillation; and
a MMW transmitter section coupled to transmit the at least one oscillation as at least one MMW clock source signals.

16. The programmable logic device of claim 14 further comprises:

the set of the plurality of CXMs and the at least one of the plurality of input/output modules receives the programming instruction via at least one set-up wireless communication resource.

17. The programmable logic device of claim 14, wherein a configurable logic block of the one or more configurable logic blocks of the CXM includes an input, an output, and a clock input; and wherein the MMW transceiver of the CXM functions to:
receive an inbound MMW signal;
convert the inbound MMW signal into an input signal;
convey the input signal to the input of at least one of the one or more configurable logic blocks;
receive an output signal from the output of the at least one of the one or more configurable logic blocks; and
convert the output signal into an outbound MMW signal.

18. The programmable logic device of claim 17, wherein the MMW transceiver comprises:

a baseband processing module coupled to:
convert an inbound symbol stream into the input signal; and convert the output signal into an outbound symbol stream;

a MMW front-end coupled to:
convert the inbound MMW signal into the inbound symbol stream;
convert the outbound symbol stream into the outbound MMW signal;
receive a MMW clock source signal; and
convert the MMW clock source signal into an oscillation; and a clock recovery circuit coupled to convert the oscillation into a clock signal, wherein the clock recovery circuit conveys the clock signal to the clock input of the at least one of the one or more of the configurable logic blocks.

19. The programmable logic device of claim 18, wherein the MMW transceiver further comprises:
a switch matrix operable to couple the input or the output of the first one of the one or more configurable logic blocks to the input or the output of a second one of the one or more configurable logic blocks.

20. The programmable logic device of claim 18, the MMW front-end comprises:
a transmit section coupled to convert the inbound MMW signal into the inbound symbol stream based on a transmit local oscillation;
a receive section coupled to convert the outbound symbol stream into the outbound MMW signal based on a receive local oscillation;
a local oscillation generator coupled to generate the transmit and receive local oscillations;
a clock local oscillation generator coupled to generate a clock reference oscillation;
a clock receiver section coupled to convert the MMW clock source signal into a down converted signal based on the clock reference oscillation; and
a calibration circuit coupled to generate an adjust signal based on the down converted signal, wherein the clock local oscillation generator adjusts the clock reference oscillation based on the adjust signal to produce the oscillation.

21. The programmable logic device of claim 14, wherein an input/output module of the plurality of input/output modules comprises:
one or more input/output (I/O) blocks, wherein an I/O block of the one or more I/O blocks includes a data input, a data output, and a clock input; and
a MMW transceiver coupled to the one or more I/O blocks, wherein the MMW transceiver functions to:
receive an inbound MMW signal;
convert the inbound MMW signal into an input signal;
convey the input signal to the input of at least one of the I/O blocks;
receive an output signal from the output of the at least one of the I/O blocks; and
convert the output signal into an outbound MMW signal.

22. The programmable logic device of claim 14 further comprises at least one of:
one or more memory modules, wherein a memory module of the one or more memory modules includes one or more memory blocks and a memory MMW transceiver; and
one or more multiplier modules, wherein a multiplier module of the one or more multiplier modules includes one or more multiplier blocks and a multiplier MMW transceiver.

23. The programmable logic device of claim 14 further comprises;
a plurality of local CXMs, wherein a local CXM of the plurality of local CXMs includes a set of the plurality of CXMs;
a plurality of regions, wherein a region of the plurality of regions includes a set of the plurality of local CXMs, wherein a wireless communication resource of the wireless communication resources includes at least one of a division multiple access slot and a channel of a frequency band, wherein the wireless communication resources are partitioned into a frequency band section for clock source signals communications, a frequency band for set-up communications, a frequency band section for communications within the local CXM, a frequency band section for communications within the region, and a frequency band for communications between two or more of the plurality of regions.

24. The programmable logic device of claim 14 further comprises;
a plurality of wireless communication transmission mediums, wherein the programming instruction indicates allocation of a wireless communication transmission medium of the plurality of wireless communication transmission mediums for a wireless communication resource of the one or more wireless communication resources.

* * * * *